(12) United States Patent
Adachi

(10) Patent No.: US 12,007,641 B2
(45) Date of Patent: Jun. 11, 2024

(54) SUBSTRATE WITH LIGHT-SHIELDING FILM, MANUFACTURING METHOD OF THE SUBSTRATE, AND DISPLAY DEVICE HAVING THE SUBSTRATE

(71) Applicant: Japan Display Inc., Tokyo (JP)

(72) Inventor: Koichiro Adachi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/847,366

(22) Filed: Jun. 23, 2022

(65) Prior Publication Data

US 2023/0017110 A1 Jan. 19, 2023

(30) Foreign Application Priority Data

Jul. 14, 2021 (JP) .................................. 2021-116186

(51) Int. Cl.
*G02F 1/1335* (2006.01)
*H01L 27/12* (2006.01)

(52) U.S. Cl.
CPC .. *G02F 1/133512* (2013.01); *G02F 1/133519* (2021.01); *H01L 27/124* (2013.01)

(58) Field of Classification Search
None
See application file for complete search history.

(56) References Cited

U.S. PATENT DOCUMENTS

| | | | | |
|---|---|---|---|---|
| 6,285,424 B1 * | 9/2001 | Yoshida | ............ | G02F 1/133512 |
| | | | | 430/7 |
| 2004/0201798 A1 * | 10/2004 | Yeh | ................ | G02F 1/133516 |
| | | | | 349/106 |
| 2011/0236604 A1 | 9/2011 | Fujiwara et al. | | |
| 2016/0370646 A1 * | 12/2016 | Nishiyama | .............. | G03F 7/033 |
| 2019/0155095 A1 * | 5/2019 | Chen | ...................... | G02B 1/113 |
| 2019/0227371 A1 * | 7/2019 | Kawamura | ....... | G02F 1/136286 |

FOREIGN PATENT DOCUMENTS

| | | | | | |
|---|---|---|---|---|---|
| JP | | H11119007 A | * | 4/1999 | |
| JP | | 2011-197521 A1 | | 10/2011 | |
| WO | WO-2013031171 A1 | * | 3/2013 | ............. | G02B 5/201 |

* cited by examiner

*Primary Examiner* — Shan Liu
(74) *Attorney, Agent, or Firm* — K&L Gates LLP

(57) ABSTRACT

Disclosed is a black-matrix substrate including a substrate, a light-shielding film located over the substrate and having a plurality of openings, and a plurality of color filters arranged in the plurality of openings. The light-shielding film includes a base film over the substrate, a metal film over the base film, and a low-reflectance film located between the base film and the metal film and has an optical reflectance lower than that of the metal film. The base film may include at least one of a resin and an inorganic compound.

11 Claims, 19 Drawing Sheets

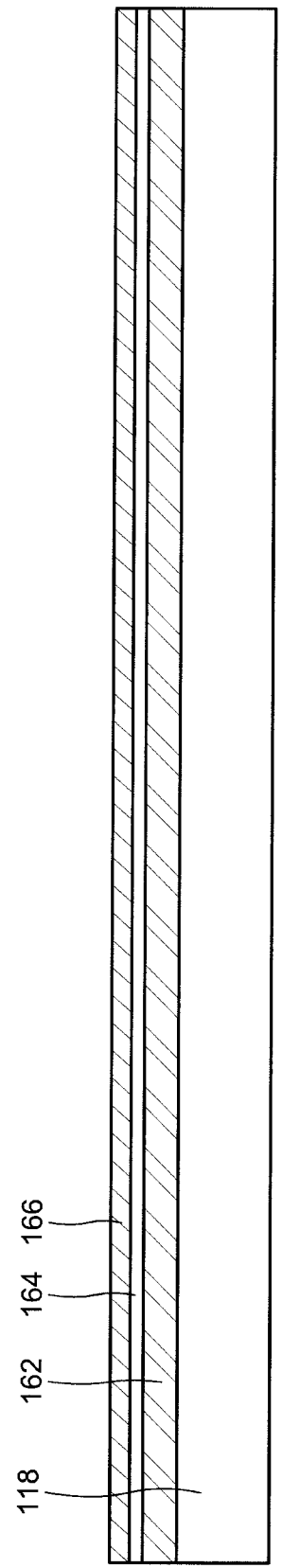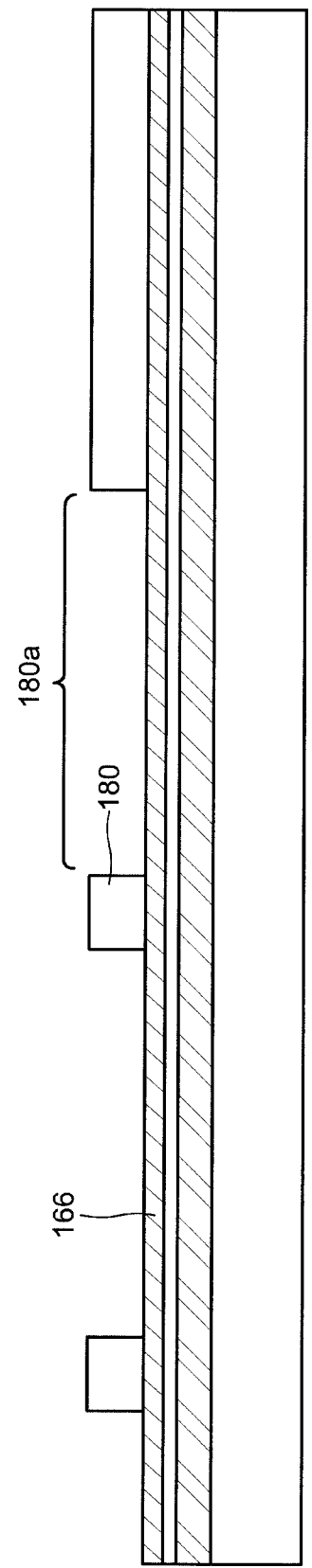

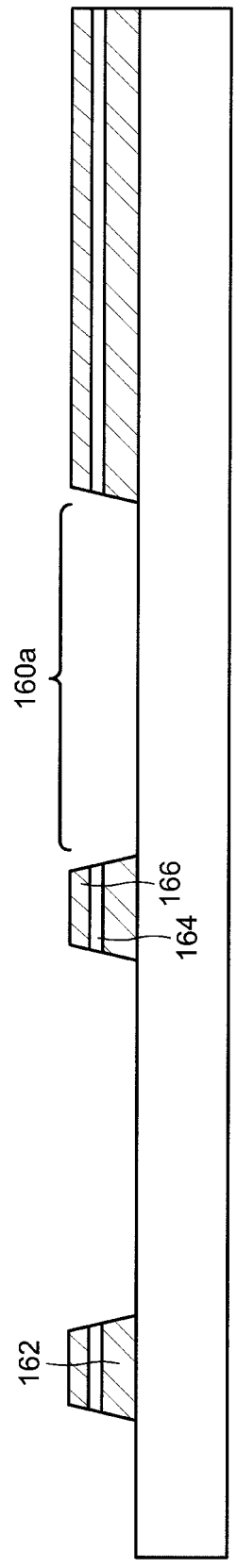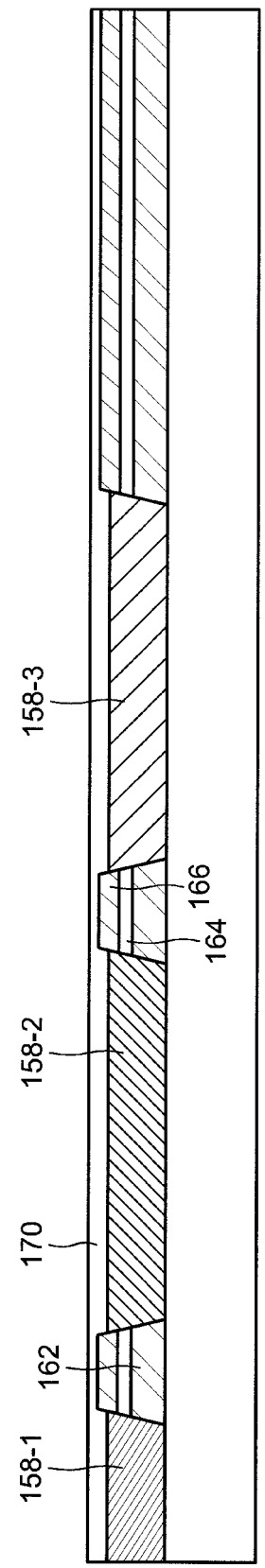

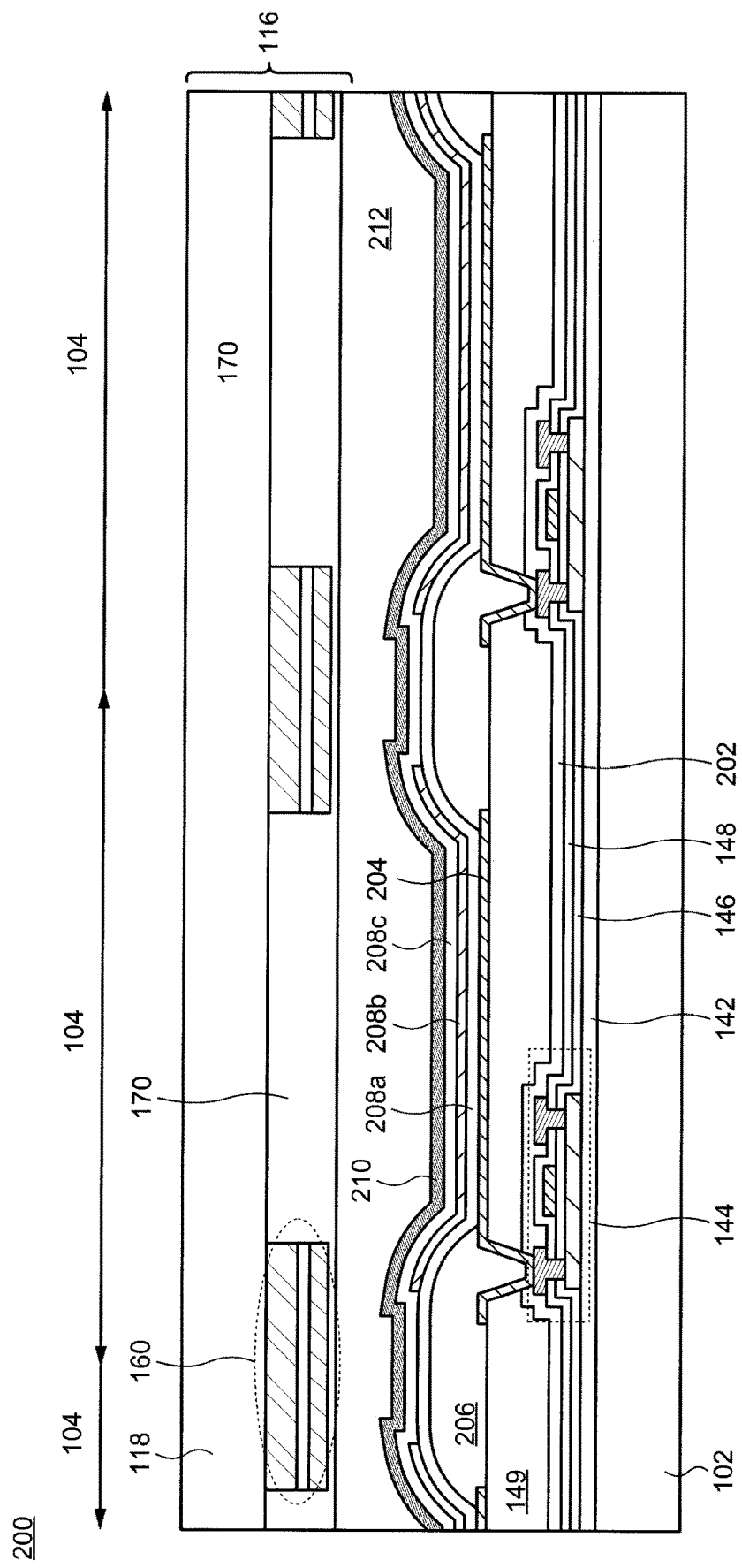

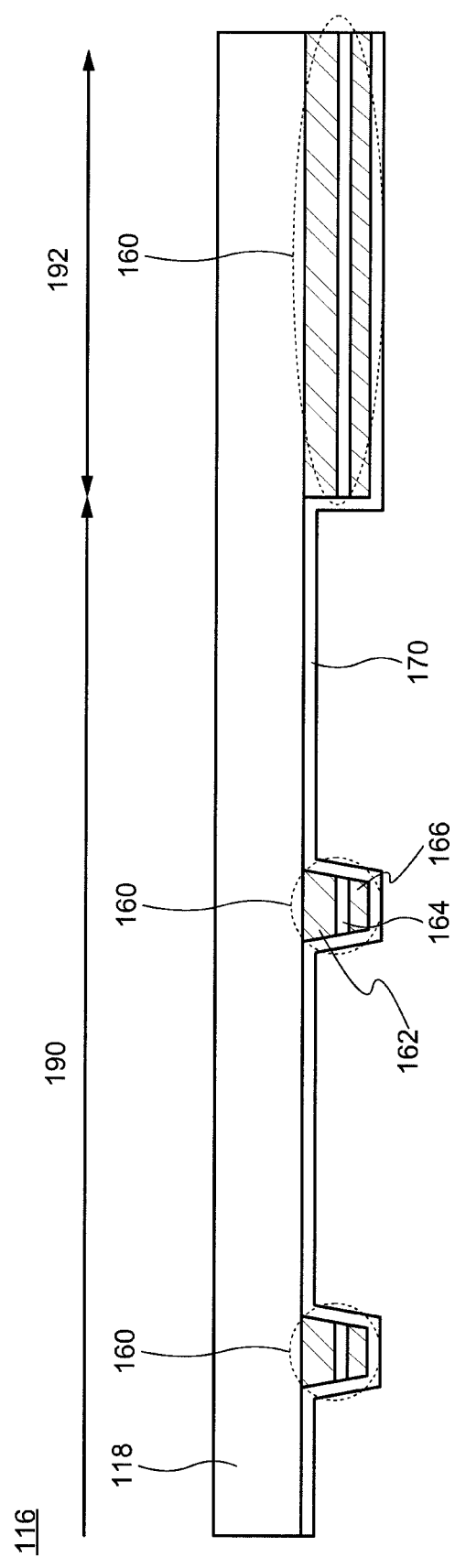

SUBSTRATE WITH LIGHT-SHIELDING FILM, MANUFACTURING METHOD OF THE SUBSTRATE, AND DISPLAY DEVICE HAVING THE SUBSTRATE

CROSS REFERENCE TO RELATED APPLICATIONS

This application claims the benefit of priority to Japanese Patent Application No. 2021-116186, filed on Jul. 14, 2021, the entire contents of which are incorporated herein by reference.

FIELD

An embodiment of the present invention relates to a substrate provided with a light-shielding film, a manufacturing method of the substrate, a display device including the substrate, and a manufacturing method of the display device.

BACKGROUND

A liquid crystal display device is currently one of the most widely used display devices. A liquid crystal display device includes a backlight and a liquid crystal module over the backlight, where the liquid crystal module has a substrate, a plurality of liquid crystal elements provided over the substrate, and a counter substrate over the liquid crystal elements as fundamental components. Gradation of the light radiated from the backlight is controlled by the liquid crystal elements, and color information is provided by color filters formed on the counter substrate. A light-shielding film (also called a black matrix) is disposed between the adjacent color filters in order to improve the contrast of displayed images (for example, see Japanese Patent Application Publication No. 2011-197521).

SUMMARY

An embodiment of the present invention is a substrate with a light-shielding film. The substrate with the light-shielding film includes a substrate, a light-shielding film located over the substrate and having a plurality of openings, and a plurality of color filters arranged in the plurality of openings. The light-shielding film includes a base film over the substrate, a metal film over the base film, and a low-reflection film located between the base film and the metal film and having an optical reflectance lower than that of the metal film.

An embodiment of the present invention is a display device. The display device includes an array substrate having a plurality of pixels and a substrate with a light-shielding film over the array substrate. The substrate with the light-shielding film includes a counter substrate, a light-shielding film located under the counter substrate and having a plurality of openings, and a plurality of color filters arranged in the plurality of openings. The light-shielding film includes a base film under the counter substrate, a metal film under the base film, and a low-reflection film located between the base film and the metal film and having an optical reflectance lower than that of the metal film.

An embodiment of the present invention is a method for manufacturing a substrate with a light-shielding film. The method includes: forming, over a substrate, a base film, a low-reflection film, and a metal film in this order to form a light-shielding film; forming, over the light-shielding film, a resist mask having a plurality of through holes, collectively etching the low-reflection film and the metal film in the plurality of through holes of the resist mask to form a plurality of openings exposing the base film, simultaneously removing the resist mask and the base film overlapping the plurality of openings by etching, and forming a color filter in each of the plurality of openings.

An embodiment of the present invention is a method for manufacturing a display device. The method includes: forming a plurality of pixels over a first substrate, forming, over a second substrate, a base film, a low-reflection film, and a metal film in this order to form a light-shielding film, forming, over the light-shielding film, a resist mask having a plurality of through holes, collectively etching the low-reflection film and the metal film in the plurality of through holes of the resist mask to form a plurality of openings exposing the base film, etching the base film to remove the base film overlapping the plurality of openings, forming a color filter in each of the plurality of openings, and fixing the first substrate and the second substrate so that the pixels and the color filters are sandwiched by the first substrate and the second substrate.

BRIEF DESCRIPTION OF DRAWINGS

FIG. 11A and FIG. 11B are schematic cross-sectional views showing a manufacturing method of a BM substrate according to an embodiment of the present invention.

FIG. 13A and FIG. 13B are schematic cross-sectional views showing a manufacturing method of a BM substrate according to an embodiment of the present invention.

FIG. 18 is a schematic cross-sectional view of a display device according to an embodiment of the present invention.

FIG. 19 is a schematic cross-sectional view of a BM substrate according to an embodiment of the present invention.

DESCRIPTION OF EMBODIMENTS

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate. When a plurality of the same or similar structures is collectively represented, a reference number is used, while a hyphen and a natural number follow the reference number when the structures are independently represented. In addition, when a part of a structure is represented, a small letter of the alphabet may be provided after the reference number.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the specification and claims, an expression that two structural members "orthogonally intersect" includes not only a state where these two structural members perpendicularly (90°) intersect but also a state where these structural members intersect at an angle of 90±10°.

In the specification and the claims, an expression "a structure is exposed from another structure" means a mode in which a part of the structure is not covered by the other structure and includes a mode where the part uncovered by the other structure is further covered by another structure.

First Embodiment

In the present embodiment, a substrate with a light-shielding film (hereinafter, referred to as a BM substrate or a black-matrix substrate) according to an embodiment of the present invention and a display device 100 including the BM substrate are explained. In the present embodiment, a mode is explained where the display device 100 is a liquid crystal display device. Hereinafter, although an example is shown where the display device 100 is an FFS (Fringe Field Switching) liquid crystal display device, the display device 100 may be an IPS (In-Plane Switching) liquid crystal display device, a TN (Twisted Nematic) liquid crystal display device, or a VA (Vertical Alignment) liquid crystal display device.

1. Outline Structure of Display Device

Figure 1:
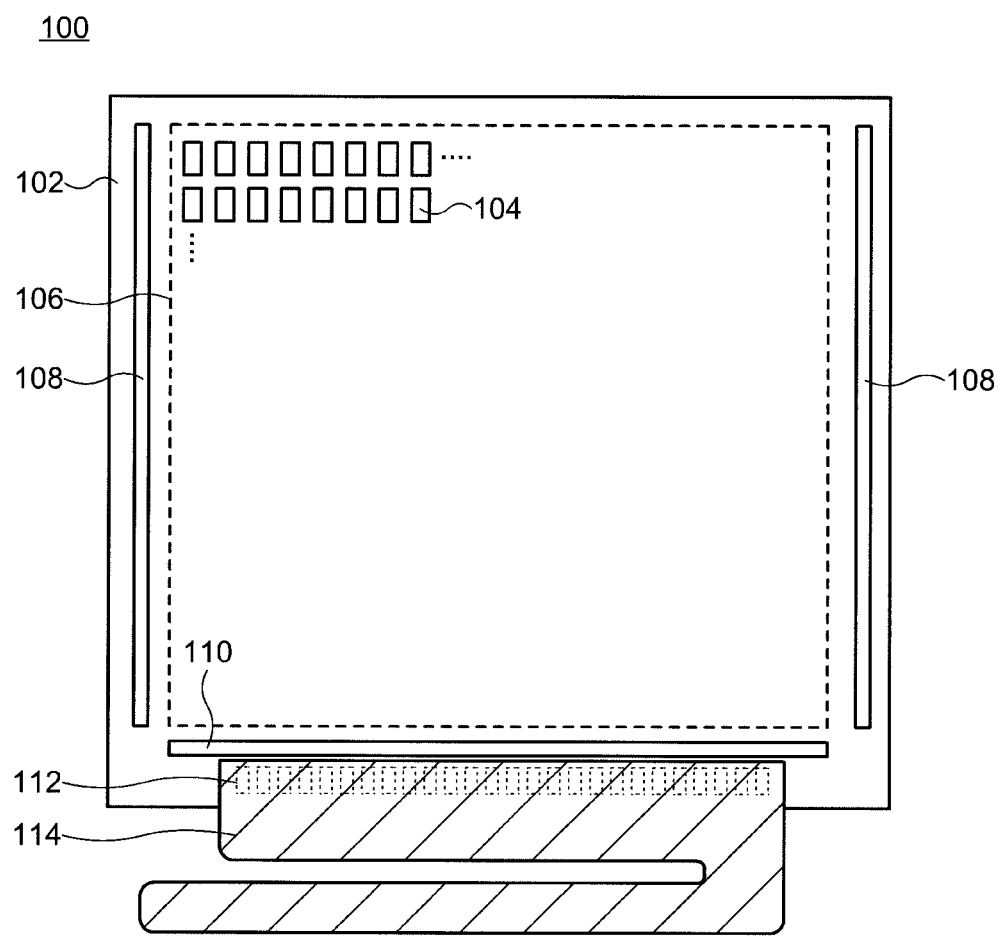
FIG. 1 is a schematic top view of a display device according to an embodiment of the present invention.

A schematic top view of the display device 100 is shown in FIG. 1. As depicted in FIG. 1, the display device 100 includes an array substrate 102 and further has a BM substrate over the array substrate 102 and a liquid crystal layer (described below) between the array substrate 102 and the BM substrate. The display device 100 may further include a backlight (not illustrated) irradiating the display device 100 with light. The BM substrate and the liquid crystal layer are not illustrated in FIG. 1 for visibility.

2. Array Substrate

The array substrate 102 is a light-transmitting substrate including glass, quartz, or a resin such as a polyimide and a polyamide. The resin may be a thermosetting resin or a thermoplastic resin (hereinafter, the same is applied). The array substrate 102 may have flexibility. A variety of patterned insulating films, conductive films, and semiconductor films are appropriately arranged over the array substrate 102, and a plurality of pixels 104, driver circuits for driving the pixels 104 (gate-line driver circuits 108 and a signal-line driver circuit 110), terminals 112, and a variety of wirings (not illustrated) connecting these components are formed with these films. A region including the plurality of pixels 104 is a display region 106, and a region other than the display region 106 is referred to as a peripheral region. A connector 114 such as a flexible printed circuit (FPC) substrate is electrically connected to the terminals 112, and image signals and a power source are supplied from an external circuit (not illustrated) via the connector 114. The pixels 104 are controlled with the gate-line driver circuits 108 and the signal-line driver circuit 110 on the basis of the image signals, thereby allowing images to be displayed on the display region 106. A driver IC including an integrated circuit formed over a semiconductor substrate may be mounted on the array substrate 102 or the connector 114 instead of or together with the signal-line driver circuit 110.

Figure 2:
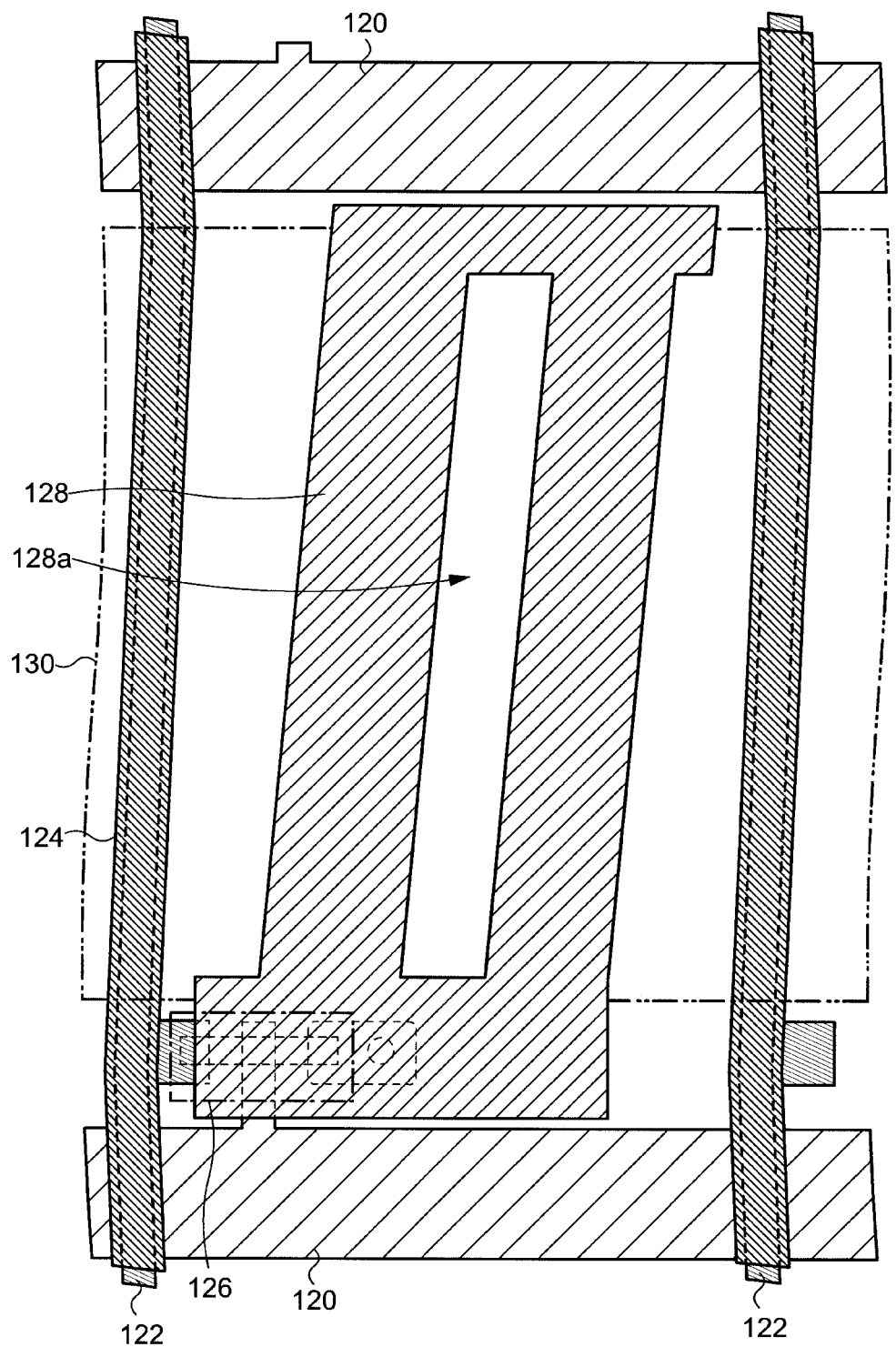
FIG. 2 is a schematic top view of a pixel of a display device according to an embodiment of the present invention.

A schematic top view of one pixel 104 is shown in FIG. 2. As shown in FIG. 2, gate lines 120 and signal lines 122 respectively extending from the gate-line driver circuits 108 and the signal-line driver circuit 110 are arranged over the array substrate 102 so as to orthogonally intersect each other. A pixel circuit connected to the gate line 120 and the signal line 122 is disposed in each pixel 104. In the example demonstrated in FIG. 2, the pixel circuit includes a thin-film transistor (TFT) 126, a pixel electrode 128, and a common electrode 130. The TFT 126 includes a part of the gate line 120 and a part of the signal line 122 as a gate electrode and a drain (or a source) electrode, respectively, and is controlled by the voltages applied to the gate line 120 and the signal line 122. The pixel electrode 128 is connected to the TFT 126 and is input with the image signals from the signal line 122 through the TFT 126. A constant potential is applied to the common electrode 130. A liquid crystal layer which is not illustrated is provided over the pixel electrode 128 and the common electrode 130, and the orientation of liquid crystal molecules included in the liquid crystal layer is controlled by a potential difference between the pixel electrode 128 and the common electrode 130. As an optional structure, assist wirings 124 electrically connected to the common electrode 130 may be arranged over the array substrate 102. Formation of the assist wirings 124 allows the common electrode 130 to be supplied with a uniform potential in the entire display region 106.

The structure of the pixel circuit is not limited to the aforementioned example, and the pixel circuit may have a plurality of TFTs as well as one or more other elements such as a capacitor element. Moreover, although the common electrode 130 extends parallel to the gate lines 120 across the plurality of pixels 104 in the example demonstrated in FIG. 2, the common electrode 130 may be arranged parallel to the signal lines 122 or independently disposed in each pixel 104. In addition, the pixel electrode 128 may have one or more slits 128a, or a pixel electrode without any slits 128a may be used. Alternatively, the pixel electrode 128 may have a comb shape.

Figure 3:
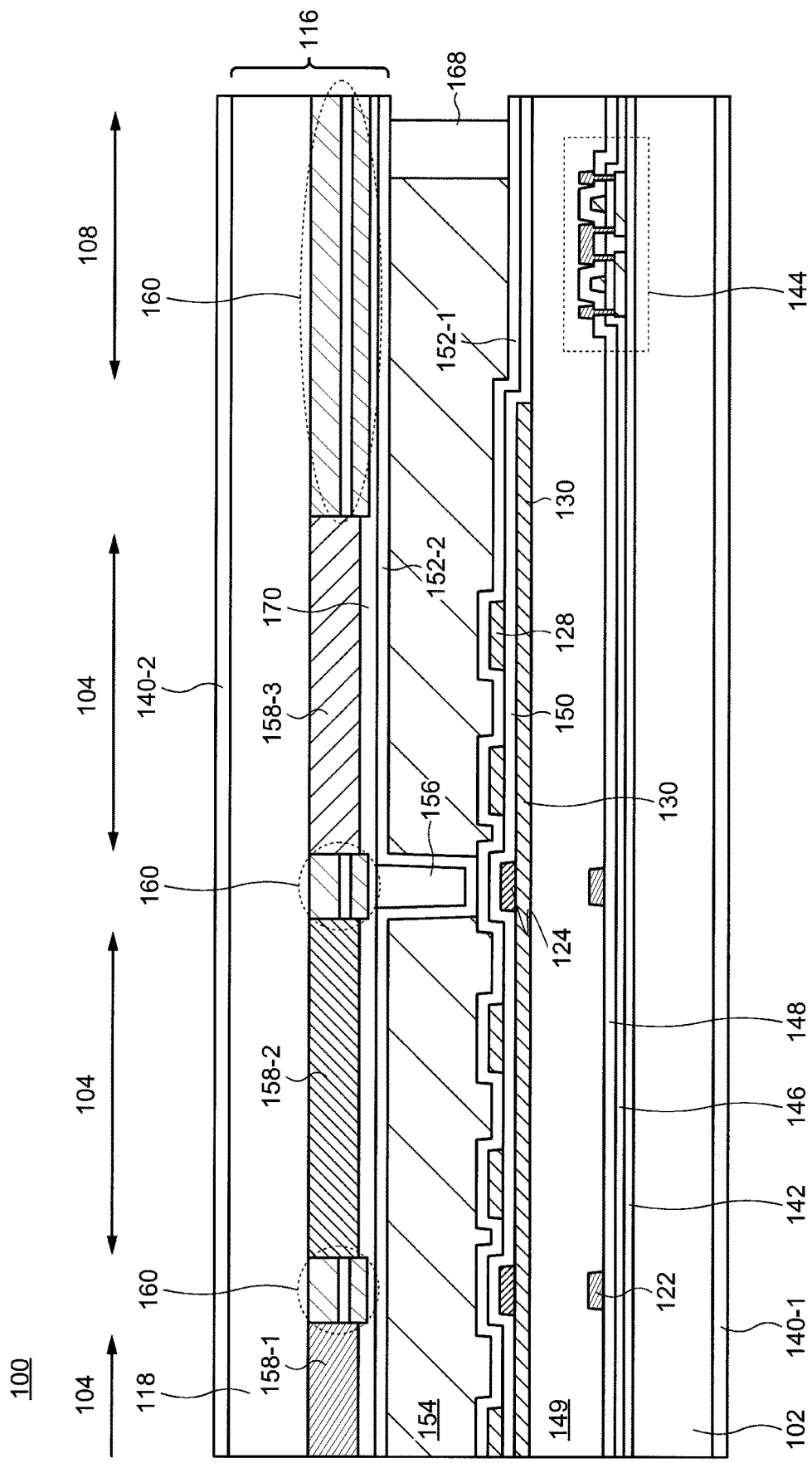
FIG. 3 is a schematic cross-sectional view of a display device according to an embodiment of the present invention.

A schematic cross-sectional view of the plurality of pixels 104 and the peripheral region is shown in FIG. 3. As shown in FIG. 3, a variety of elements and wirings such as a TFT 144 is arranged in the gate-line driver circuit 108 formed in the peripheral region, and these elements, wirings, and the pixel circuits are disposed over the array substrate 102 directly or through an undercoat 142. A gate insulating film 146, an interlayer insulating film 148, and the like, which also function as a portion of the TFT 126, are arranged over the array substrate 102, over which the signal lines 122 are formed.

A leveling film 149 is further provided over the array substrate 102 so as to cover the elements and the wirings formed in the peripheral region as well as the TFT 126 disposed in each pixel circuit, thereby forming a flat surface over the leveling film 149. The common electrode 130 is further formed over the leveling film 149, over which the pixel electrode 128 is arranged through an interelectrode insulating film 150. The pixel electrode 128 and the common electrode 130 are electrically insulated from each other by the interelectrode insulating film 150. The pixel electrode 128 is electrically connected to the TFT 126 through an opening (not illustrated) formed in the interelectrode insulating film 150, leveling film 149, and the interlayer insulating film 148. In the case where the assist wiring 124 is formed, the assist wiring 124 is arranged over or under and in contact with the common electrode 130. An orientation film 152-1 is further disposed over the pixel electrode 128 to control the orientation of the liquid crystal molecules.

3. BM Substrate

The BM substrate 116 includes a light-transmitting counter substrate 118 containing glass, quartz, or a resin such as a polyimide and a polyamide, and a light-shielding film 160 and a plurality of color filters 158 are disposed thereover (under the counter substrate 118 in FIG. 3. The same is applied below) directly or through an undercoat which is not illustrated. Similar to the array substrate 102, the counter substrate 118 may have flexibility.

3-1. Light-Shielding Film

Figure 4:
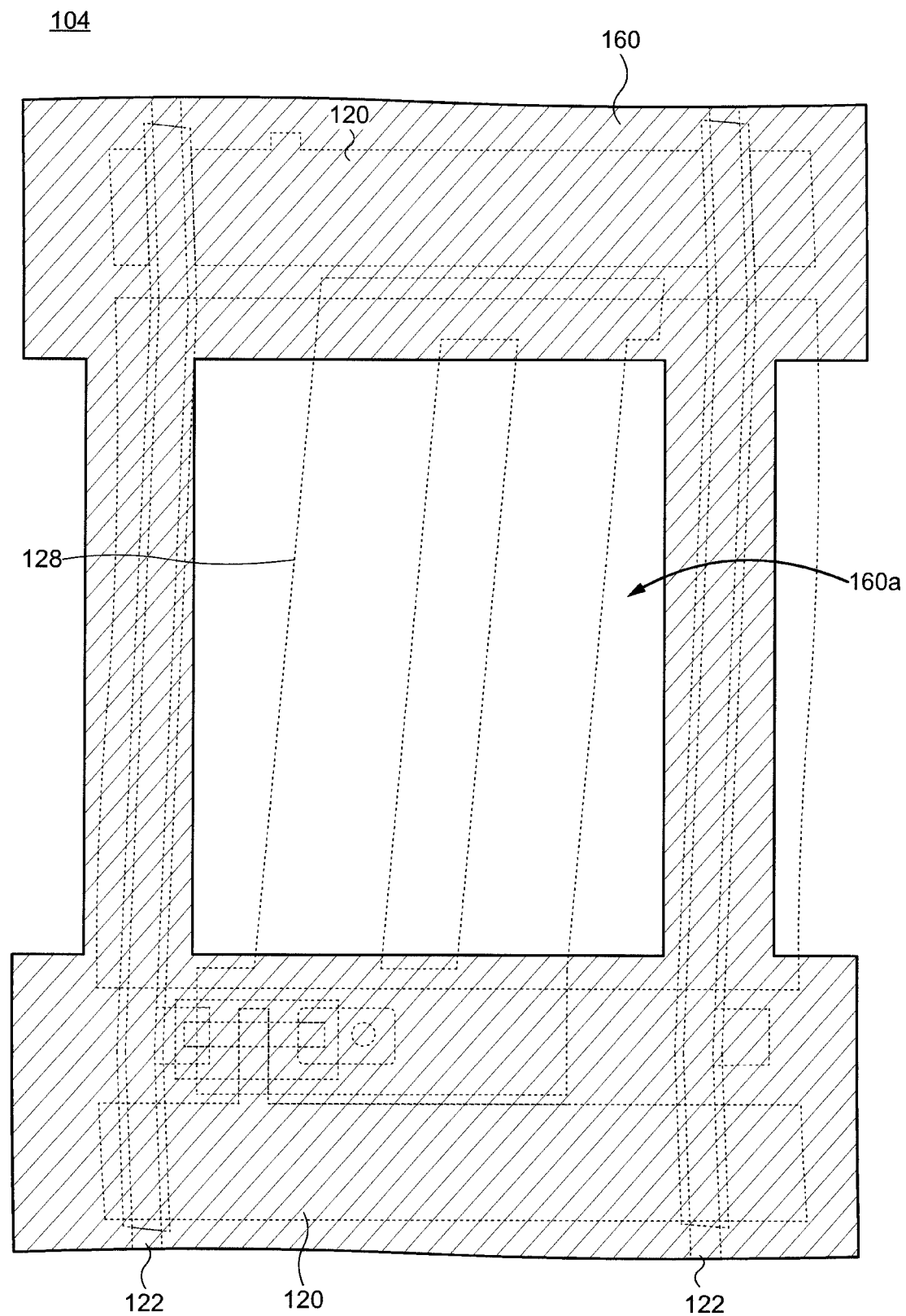
FIG. 4 is a schematic top view of a pixel of a display device according to an embodiment of the present invention.

The light-shielding film 160 has a plurality of openings overlapping the plurality of pixels 104 and has a function to partly shield the light passing through the liquid crystal layer 154. The light-shielding film 160 is provided to overlap a region between the adjacent pixels 104 and the peripheral region. Hence, the light-shielding film 160 exhibits a lattice shape, and one opening 160a overlaps one pixel 104 as shown in a schematic top view of FIG. 4, which allows the plurality of openings 160a to be arranged in a matrix form. The light-shielding film 160 may be arranged so as to overlap the gate lines 120, the signal lines 122, the TFTs 126, the assist wirings 124, and the like and at least a part of the pixel electrode 128 overlaps the opening 160a.

Figure 5A:
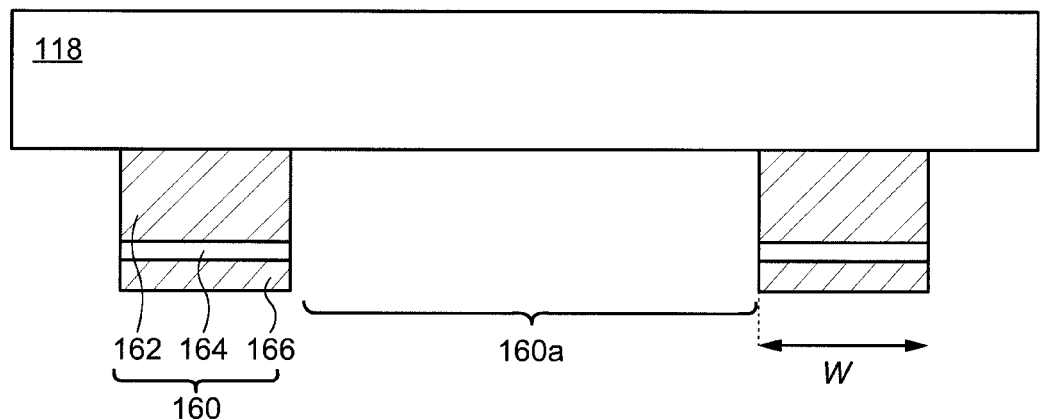
FIG. 5A to FIG. 5C are schematic cross-sectional views of a BM substrate according to an embodiment of the present invention.

A cross section of a part of the BM substrate 116 is schematically shown in FIG. 5A. As can be understood from FIG. 5A, the light-shielding film 160 has a three-layer structure where a base film 162, a low-reflectance film 164, and a metal film 166 are stacked in this order from the counter substrate 118. The base film 162, the low-reflectance film 164, and the metal film 166 each have a plurality of openings overlapping each other, and the openings 160a are formed with these openings.

The base film 162 contains at least one of a resin and an inorganic compound. Although an acrylic resin, an epoxy resin, a polysiloxane resin, a polyimide resin, a polyamide resin, and the like are exemplified as a resin, a resin other than these resins may be used. As an inorganic compound, a silicon-containing inorganic compound is exemplified. As a silicon-containing inorganic compound, silicon oxide, silicon nitride, silicon oxynitride, silicon nitride oxide, and the like are represented. The base film 162 may have a light-transmitting property.

The low-reflectance film 164 is a film having a relatively low reflectance with respect to visible light. It is possible to suppress reflection of external light incident from the side of the counter substrate 118 by providing the low-reflectance film 164, thereby suppressing the reflection on the display region 106. With this mechanism, reflection and glare on the display region 106 are effectively suppressed. The low-reflectance film 164 is configured to have a reflectance with respect to visible light equal to or less than 50%, equal to or less than 30%, or equal to or less than 10%.

Specifically, the low-reflectance film 164 is composed of stacked films of dielectrics with different refractive indexes. More specifically, the low-reflectance film 164 may have a structure in which a film containing a high-refractive-index dielectric with a refractive index equal to or higher than 2.0 and equal to or lower than 3.5, such as titanium oxide, niobium oxide, tantalum oxide, and zirconium oxide, and a film containing a low-refractive-index dielectric with a refractive index equal to or higher than 1.3 and equal to or lower than 2.0, such as silicon oxide and magnesium fluoride, are stacked. The number of the films containing a high-refractive-index dielectric and the number of the films containing a low-refractive-index dielectric may be independently equal to or larger than 1.

Alternatively, the low-reflectance film 164 may include one or more films containing a metal with a relatively low reflectance with respect to visible light, such as tungsten, molybdenum, titanium, and vanadium, or an alloy including a metal selected from these metals.

Alternatively, the low-reflectance film 164 may include one or more films containing a metal with a relatively high absorptivity of visible light, such as niobium, chromium, iron, germanium, nickel, and manganese, or an alloy containing a metal selected from these metals. Alternatively, the low-reflectance film 164 may include carbon having a relatively high absorptivity of visible light. Carbon may have a stacked layer structure such as graphite or may exist in an amorphous state.

The metal film 166 includes one or more films containing a metal such as aluminum, titanium, silver, molybdenum, tungsten, copper, and chromium or an alloy containing a metal selected from these metals. The materials and the structures of the metal film 166 and the low-reflectance film 164 are selected so that the reflectance of the latter with respect to visible light is lower than that of the former.

The light-shielding film 160 may be configured so that a thickness of the base film 162 is larger than both thicknesses of the low-reflectance film 164 and the metal film 166. Furthermore, the base film 162 may be configured so that the thickness thereof is larger than a summation of the thicknesses of the low-reflectance film 164 and the metal film 166. On the other hand, the thickness of the metal film 166 may be larger than the thickness of the low-reflectance film 164. For example, the thickness of the base film 162 may be selected from a range equal to or more than 500 nm and equal to or less than 2000 nm. The thickness of the low-reflectance film 164 may be selected from a range equal to or more than 5 nm and equal to or less than 100 nm. The thickness of the metal film 166 may be selected from a range equal to or more than 50 nm and equal to or less than 200 nm.

Figure 5B:
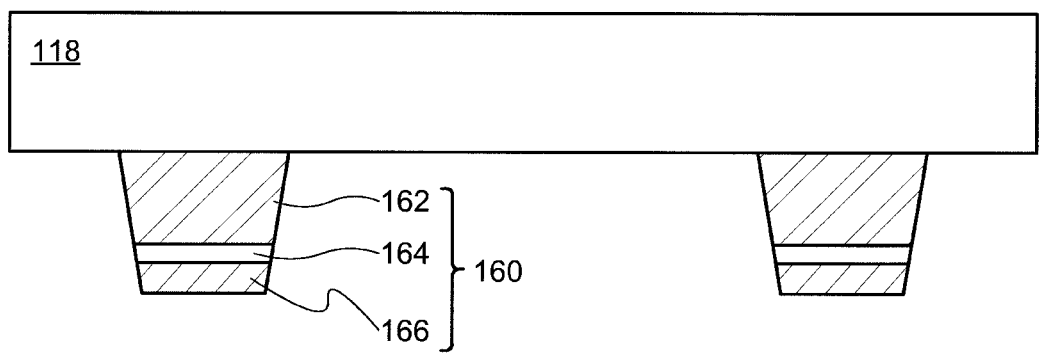
Figure 5C:
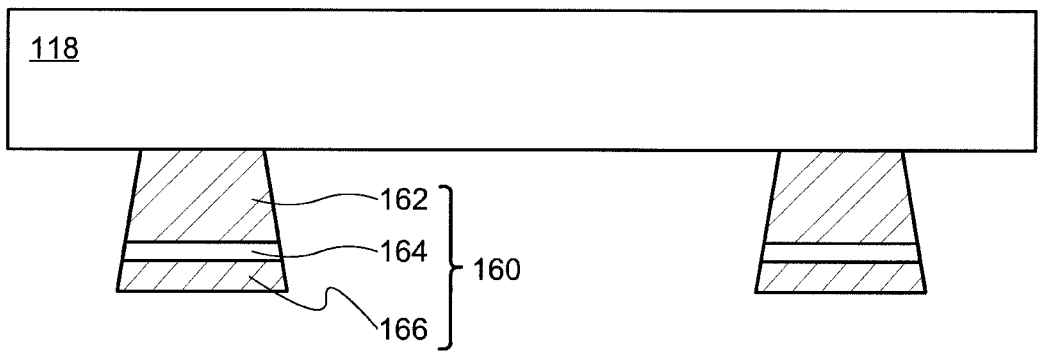
Figure 6A:
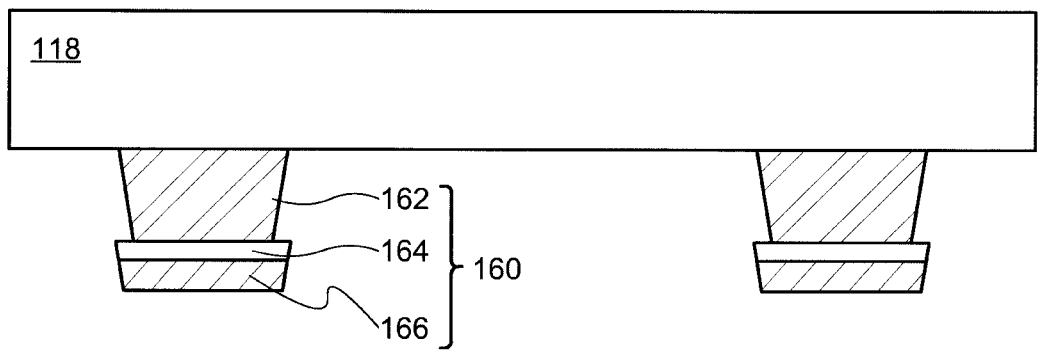
FIG. 6A to FIG. 6C are schematic cross-sectional views of a BM substrate according to an embodiment of the present invention.
Figure 6B:
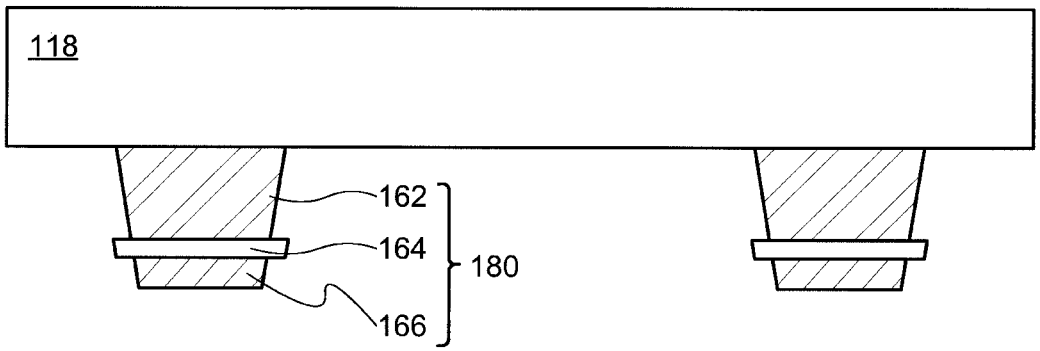
Figure 6C:
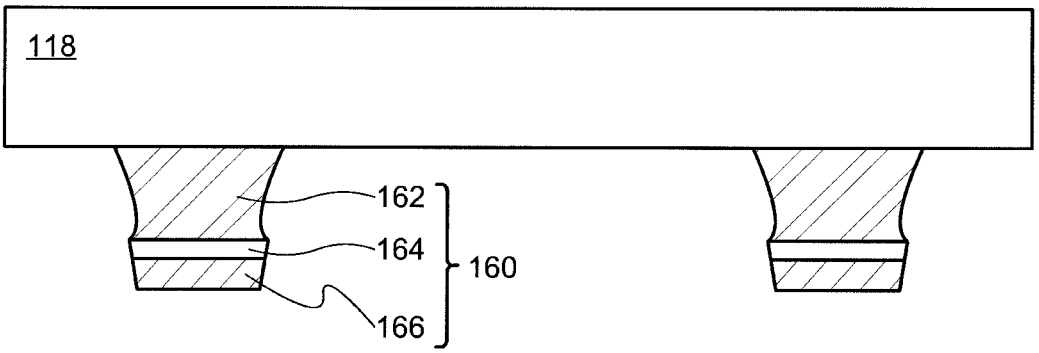

The light-shielding film 160 may be formed so that a width W thereof is constant in a normal-line direction of a main surface of the counter substrate 118. Alternatively, the light-shielding film 160 may be formed so as to have a taper structure as shown in FIG. 5B. Specifically, the light-shielding film 160 may be configured so that the width W decreases with increasing distance from the counter substrate 118 in the normal-line direction. Alternatively, the light-shielding film 160 may be configured so that the width W increases with increasing distance from the counter substrate 118 in the normal-line direction as shown in FIG. 5C. In both cases, side surfaces of the base film 162 and the low-reflectance film 164 may be continuous, and side surfaces of the low-reflectance film 164 and the metal film 166 may be continuous. Alternatively, the side surfaces of the base film 162 and the low-reflectance film 164 and/or the side surfaces of the low-reflectance film 164 and the metal film 166 may not be continuous so that there may be a step between the base film 162 and the low-reflectance film 164 and/or between the low-reflectance film 164 and the metal film 166 as shown in FIG. 6A and FIG. 6B. Moreover, one or more of the side surfaces of the base film 162, low-reflectance film 164, and the metal film 166 may be bent as shown in FIG. 6C. Here, the width W of the light-shielding film 160 is a length of the light-shielding film 160 in a direction which is perpendicular to an extending direction of the light-shielding film 160 between the adjacent pixels 104 and which is parallel to the main surface of the counter substrate 118.

3-2. Color Filter

Each of the plurality of color filters 158 is a film providing color to the light and is formed in the opening 160a of the light-shielding film 160 so as to be in contact with at least one of the base film 162, the low-reflectance film 164, and the metal film 166. The plurality of color filters 158 may be in contact with the counter substrate 118. The plurality of color filters 158 is structured with a plurality of color filters 158-1 selectively transmitting red light, a plurality of color filters 158-2 selectively transmitting green light, and a plurality of color filters 158-2 selectively transmitting blue light so that the optical properties of the adjacent color filters 158 are different from each other. Specifically, the color filter 158-1, the color filter 158-2, and the color filter 158-3 are different in color, absorption wavelength, extinction coefficient, and the like from one another. In addition, the optical properties of the base film 162, such as the color, the absorption wavelength, the extinction coefficient, and the like are also different from the optical properties of the color filters 158-1, 158-2, and 158-3. For example, the base film 162 may be transparent when the color filters 158 each have their own color. Therefore, the optical properties of two adjacent color filters 158 are different from those of the base film 162 sandwiched therebetween. Note that the color filter 158 may have yellow or white color different from the aforementioned red, blue, and green colors or may be colorless, for example.

Figure 7A:
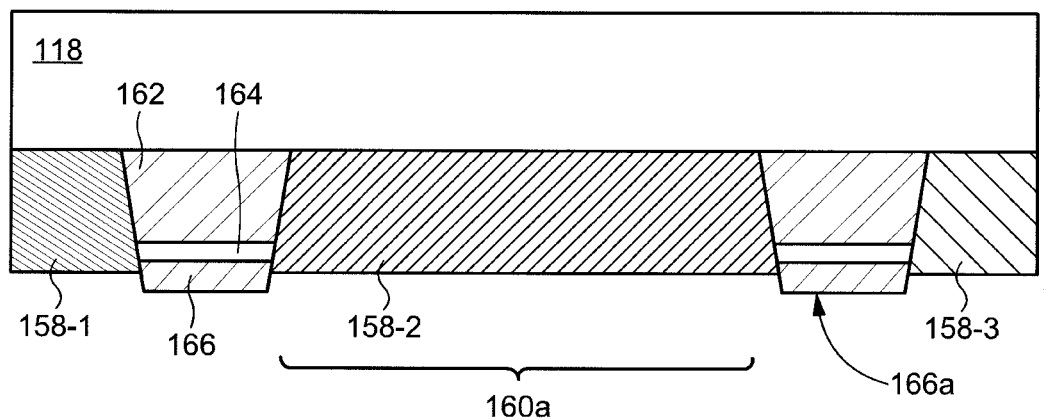
FIG. 7A and FIG. 7B are schematic cross-sectional views of a BM substrate according to an embodiment of the present invention.
Figure 7B:
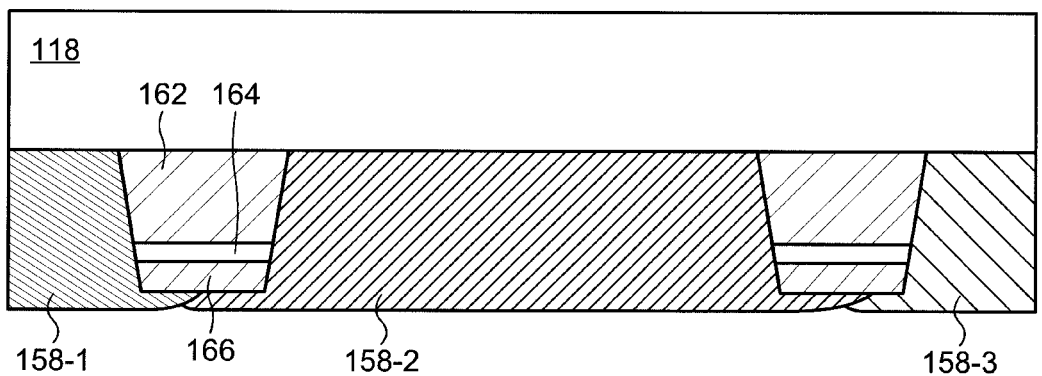

As shown in FIG. 7A, each color filter 158 may be disposed so as to be accommodated in one opening 160a. In other words, a height of each color filter 158 (a length in a normal-line direction of the counter substrate 118. The same is applied below.) may be smaller than a height of the light-shielding film 160. In this case, a top surface 166a of the metal film 166 (an opposite surface with respect to a surface on the side of the low-reflectance film 164) is not covered by the color filter 158 and is exposed from the color filter 158. However, the height of the color filter 158 may be larger than the height of the light-shielding film 160. In this case, at least one of the color filters 158 covers the top surface 166a of the metal film 166. A part of the adjacent color filters 158 may overlap each other over the light-shielding film 160 (FIG. 7B).

3-3. Other Components

The BM substrate 116 may further include an overcoat 170 over and in contact with the light-shielding film 160 and the color filters 158 (FIG. 3). The overcoat 170 may include a silicon-containing inorganic compound or a resin such as an acrylic resin and an epoxy resin. The formation of the overcoat 170 prevents impurities included in the color filters 158 and the light-shielding film 160 from entering the liquid crystal layer 154 and absorbs projections and depressions caused by the color filters 158 and the light-shielding film 160 to provide a flat surface.

An orientation film 152-2 over the light-shielding film 160 and the color filters 158 is further provided to the BM substrate 116 directly or through the overcoat 170. Cooperation of the orientation films 152-1 and 152-2 efficiently controls the orientation direction of the liquid crystal molecules included in the liquid crystal layer 154.

The BM substrate 116 may further have a spacer 156 as an optional component. The spacer 156 is formed over the light-shielding film 160 directly or through the overcoat 170 to overlap a part of the light-shielding film 160. The distance between the array substrate 102 and the BM substrate 116, that is, a thickness of the liquid crystal layer 154, can be controlled by the spacer 156. Note that the spacer 156 may not be provided to the BM substrate 116 but may be provided to the array substrate 102. Alternatively, particulate spacers may be dispersed in the liquid crystal layer 154 without forming the spacer 156.

4. Other Components

A sealer 168 is provided to the display device 100 for fixing the array substrate 102 and the BM substrate 116 to each other. The sealer 168 is formed to surround at least the display region 106, and the liquid crystal layer 154 is sealed in a space formed by the sealer 168, the array substrate 102, and the BM substrate 116. The display device 100 further includes a pair of polarizing plates 140-1 and 140-2 sandwiching the array substrate 102 and the BM substrate 116. The light from the backlight which is not illustrated is converted to linearly polarized light by the polarizing plate 140-1, while the polarizing plate 140-2 functions as a shutter for the light optically rotated in the liquid crystal layer 154.

As described below, the display device 100 is manufactured by forming the pixels, the driver circuits, the wirings, and the like over the array substrate 102, followed by fixing the array substrate 102 and the separately prepared BM substrate 116 to each other with the sealer 168. At this time, position alignment (alignment) of the array substrate 102 and the BM substrate 116 is carried out so that the openings 160a of the light-shielding film 160 overlap the pixels 104 and the BM substrate 116 (i.e., the portion other than the openings 160a) overlaps with the regions between the adjacent pixels 104 and the peripheral region. When the alignment is carried out, even a slight alignment shift causes a defect because tolerance for an alignment shift is severely limited in an ultra-high-definition display device (e.g., 806 dpi or more) having an extremely small pixel pitch (e.g., 5 μm to 10 μm).

Figure 8A:
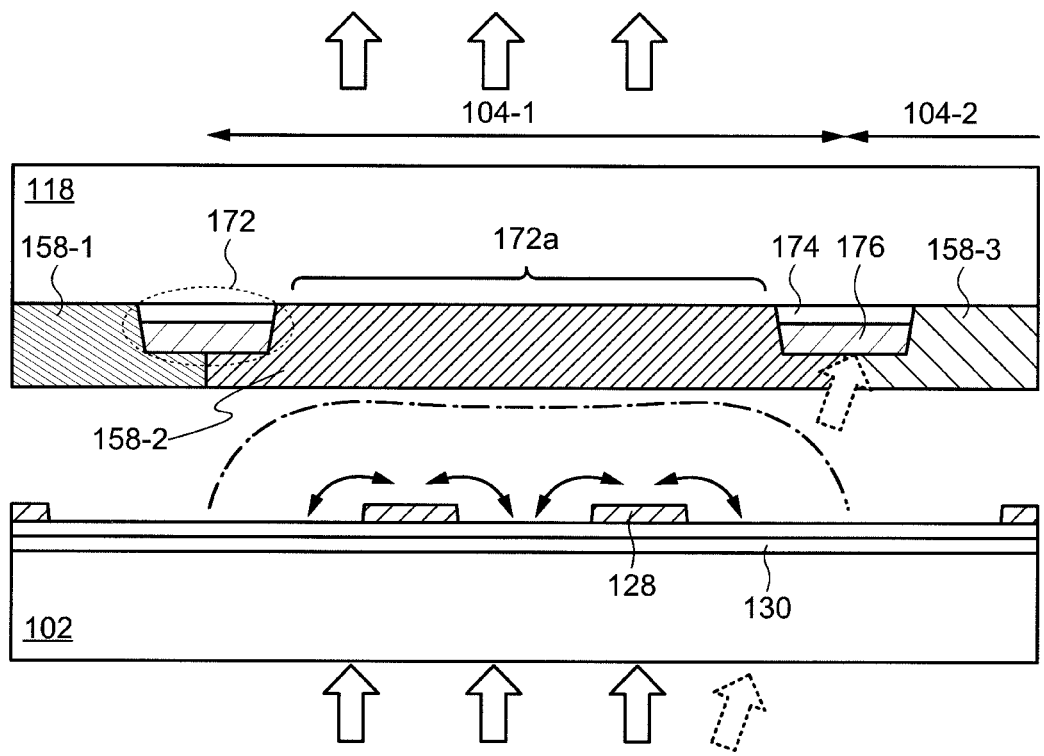
FIG. 8A and FIG. 8B are schematic cross-sectional views of a conventional BM substrate.

FIG. 8A shows a schematic cross-sectional view for a case where the BM substrate 116 provided with a light-shielding film 172 having a traditional structure, which does not include the base film 162 but is provided with a low-reflectance film 174 and a metal film 176, is appropriately aligned with the array substrate 102. In FIG. 8A, the components such as the undercoat 142 and the gate insulating film 146 are omitted. In the case where the light is selectively emitted from the pixel 140-1 provided with the color filter 158-2, for example, a potential based on an image signal is supplied to the pixel electrode 128 of the pixel 104-1 while providing a constant potential to the common electrode 130. With this process, a potential difference arises between the common electrode 130 and the pixel electrode 128 in the pixel 104-1. Accordingly, the orientation of the liquid crystal molecules changes due to the transverse electric field (curved arrows in the drawing) generated by the potential difference. The degree of the orientation decreases in a region distant from the center of the pixel 104 as demonstrated by the chain line in the drawing because the change of the orientation depends on the intensity of the transverse electric field. However, the relatively stable transverse electric field is formed in a region overlapping an opening 172*a* of the light-shielding film 172. Hence, the light of the backlight optically twists according to the orientation of the liquid crystal molecules when passing through the pixel 104-1, and then passes through the polarizing plate 140-2 after passing through the color filter 158-2 (see hollow and bold arrows in the drawing). In contrast, the light does not optically twist and is shielded by the polarizing plate 140-2 because the transverse electric field does not affect the pixel 104-2 adjacent to the pixel 104-1. Thus, light having a uniform intensity is selectively obtained from the pixel 104-1.

Moreover, the light from the backlight includes not only a component perpendicular to the main surfaces of the array substrate 104 and the counter substrate 118 but also a diagonal component (see hollow and dotted arrows in FIG. 8A). This light is also capable of passing through the polarizing plate 140-2 because this light optically rotates when affected by the transverse electric field. However, if the alignment is appropriate, this light is shielded by the light-shielding film 172 and does not leak from the display device 100. As a result, the diagonal component of the light does not leak from the adjacent pixel 104, thereby maintaining display quality.

Figure 8B:
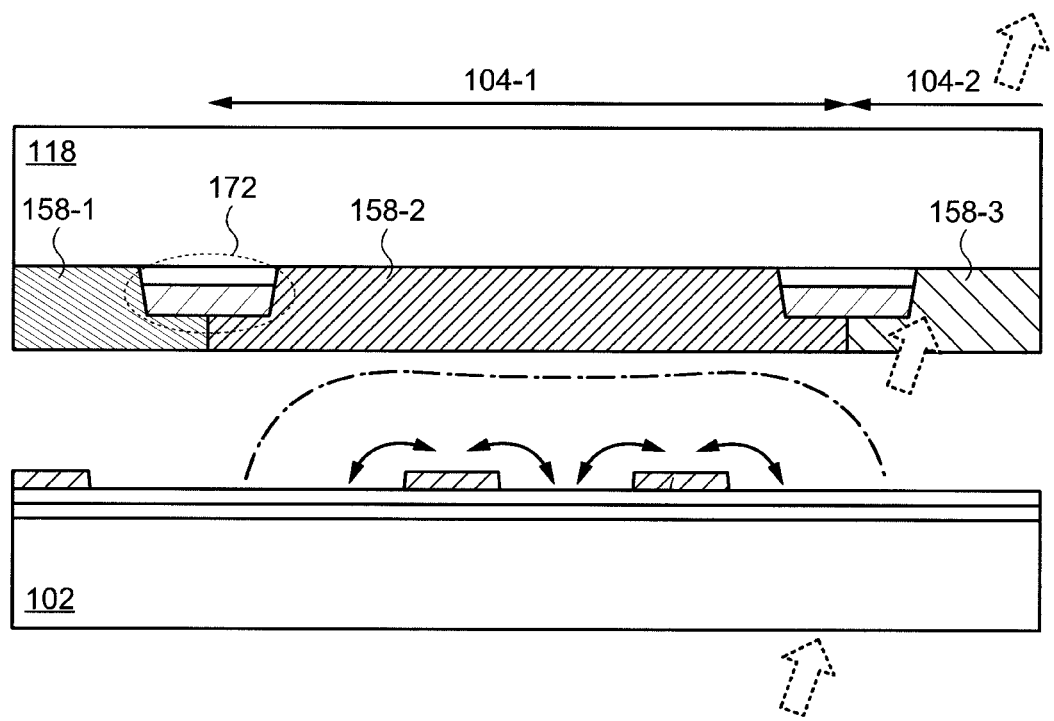

However, once an alignment shift occurs, the transverse electric field is also generated in the liquid crystal layer 154 overlapping the adjacent color filter (e.g., the color filter 158-3) as shown in FIG. 8B. Hence, a part of the diagonal component of the light from the backlight optically twists. The height of the traditional light-shielding film 172 is small because it does not include the base film 162. Accordingly, the part of the optically twisted diagonal component of the light is not shielded by the light-shielding film 172, but passes through the polarizing plate 140-2, and then is extracted after passing through the adjacent color filter 158-3 as shown in FIG. 8B. Hence, light with unintended color leaks from the adjacent pixel 104-2 in addition to the light from the target pixel 104-1, leading to a decrease in display quality.

Figure 9:
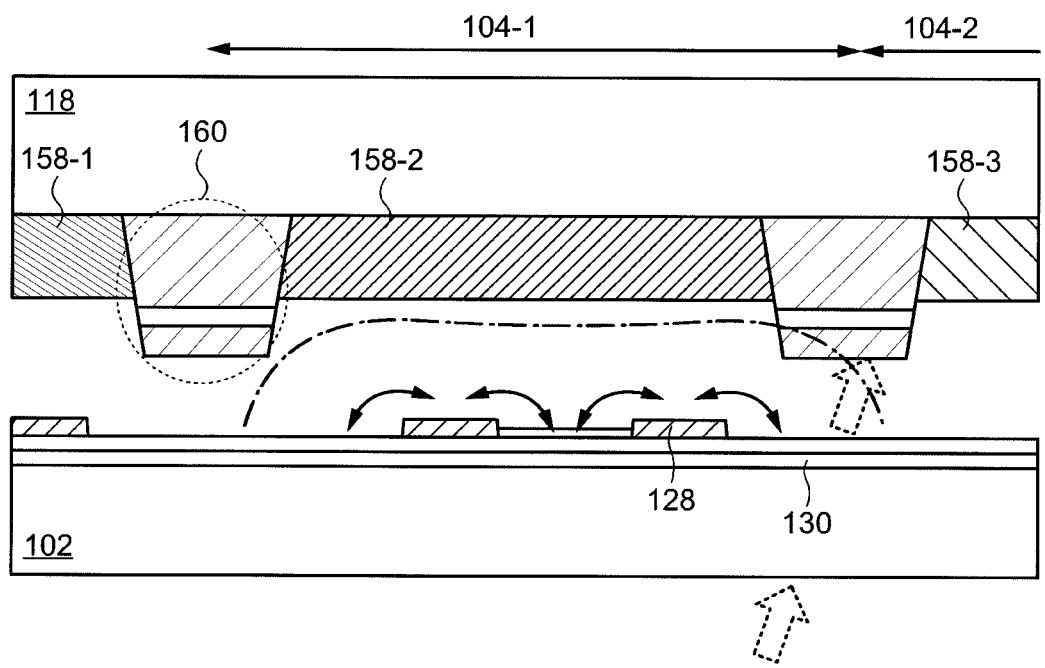
FIG. 9 is a schematic cross-sectional view of a BM substrate according to an embodiment of the present invention.

However, the total height of the light-shielding film 160 of the BM substrate 116 according to an embodiment of the present invention is large because the base film 162 with a relatively large thickness is further included as described above. Therefore, even if a part of the diagonal component of the light from the backlight optically twists due to an alignment shift, this light is shielded by the light-shielding film 160, by which the light leakage from the pixel 104-2 adjacent to the target pixel 104-1 can be effectively prevented (FIG. 9). As a result, high-quality display can be performed without a decrease in display quality caused by the alignment shift.

Figure 10A:
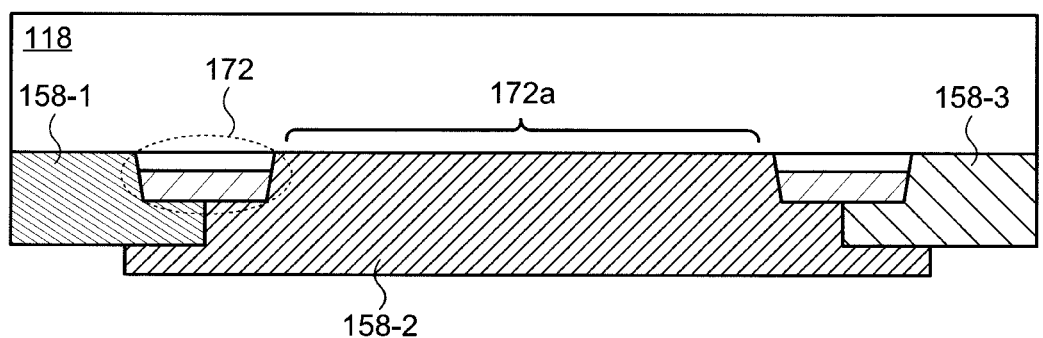
FIG. 10A and FIG. 10B are schematic cross-sectional views of a conventional BM substrate and a BM substrate according to an embodiment of the present invention, respectively.

Furthermore, the color filters 158 can be accurately formed at desired positions in the BM substrate 116 according to this embodiment. As described below, the color filters 158 may be formed with a wet-type film-formation method such as a spin-coating method and an ink-jet method. In this case, a part of the applied or discharged raw material (ink) may overflow from the opening 172*a* and deposit on the adjacent pixel 104 as shown in FIG. 10A because the height of the light-shielding film 172 is small in the BM substrate having the traditional light-shielding film 172. If the ink leaks and overlaps the pixel 104 adjacent to the target pixel 104, the optical properties of the color filter 158 of the adjacent pixel 104 may vary. This phenomenon also leads to a reduction in display quality.

Figure 10B:
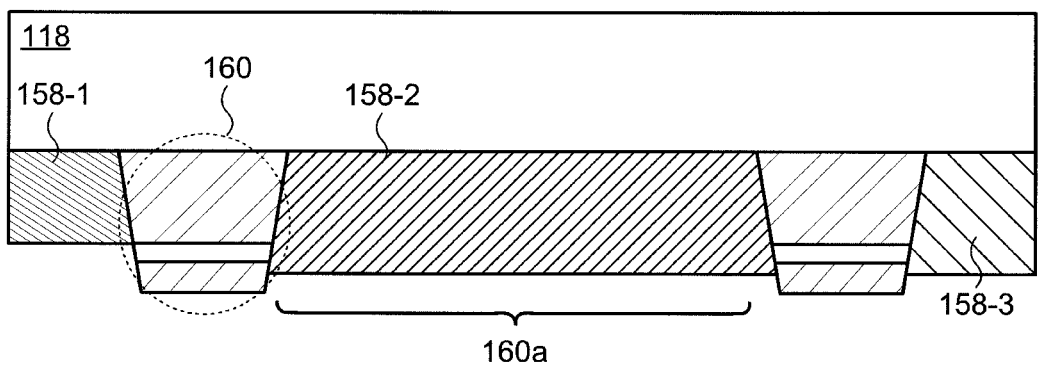

In contrast, it is possible to prevent the aforementioned ink leakage and selectively arrange the target color filter 158 in the intended opening 160*a* because the light-shielding film 160 of the BM substrate 116 according to an embodiment of the present invention has a relatively large thickness (FIG. 10B). This feature also proves that the BM substrate 116 according to an embodiment of the present invention can be preferably utilized in an ultra-high-definition display device.

In addition, the light-shielding film 160 can be formed so as to overlap the spacer 156 as shown in FIG. 3. Hence, even if a pressure is applied to the display device 100 in the normal-line direction of the array substrate 102 and the counter substrate 118, the base film 162 is able to function as a cushioning material absorbing the pressure. Accordingly, the destruction of the spacer 156 can be prevented, and the deformation of the spacer 156 is suppressed. Furthermore, it is also possible to suppress defects such as bubble generation in the liquid crystal layer 154 caused by the pressure and light-leakage resulting from the thickness variation of the liquid crystal layer 154.

Furthermore, the light-shielding film 160 has a light-shielding portion made of the low-reflectance film 174 and the metal film 176 at the tip thereof as shown in FIG. 7A and FIG. 7B, while the base film 162 structuring the portion from the low-reflectance film 174 to the surface of the counter substrate 118 may have a light-transmitting property. When the base film 162 also has a light-shielding property, the light-shielding portion defining each pixel region includes not only a thin film layer including the low-reflectance film 174 and the metal film 176 but also the base film 162 made of an organic film containing a resin. With respect to this point, although the light-shielding portion should be fabricated extremely precisely in the case of the ultra-high-definition display device 100 implemented by the present embodiment, the base film 162 made of an organic film is inferior to the low-reflectance film 174 and the metal film 176 in etching accuracy. Hence, if a light-shielding property is provided to the base film 162, a variation (aperture-ratio variation) of the pixel region might be caused. On the contrary, the base film 162 may have a light-transmitting property in the present embodiment, the pixel region is defined extremely precisely by the low-reflectance film 174 and the metal film 176, and, accordingly, the aforementioned aperture-ratio variation is suppressed. In addition, since a light-shielding region and the pixel region are defined by the low-reflectance film 174 and the metal film 176 without the base film 162, a decrease in aperture ratio caused by the presence of the base film 162 is also suppressed, even if the base film 162 under the light-shielding portion is formed in a tapered shape to raise these elements close to the substrate 102 side.

Second Embodiment

In the present invention, an example of a manufacturing method of the BM substrate 116 and the display device 100 including the BM substrate 116 is explained using schematic cross-sectional views corresponding to FIG. 3. An explanation of the structures the same as or similar to those described in the First Embodiment may be omitted.

1. Preparation of BM Substrate

First, the base film 162, the low-reflectance film 164, and the metal film 166 are formed over the counter substrate 118 in this order (FIG. 11A). The base film 162, the low-reflectance film 164, and the metal film 166 are formed so as to entirely or almost entirely cover the counter substrate 118. When the base film 162 includes a resin, the base film 162 may be formed by utilizing a wet-type film-formation method such as a spin-coating method, an ink-jet method, and a dip-coating method. When the base film 162 includes an inorganic compound, the base film 162 is formed by utilizing a sputtering method, a chemical vapor deposition (CVD) method, an evaporation method, or the like. The formation of the low-reflectance film 164 and the metal film 166 may also be carried out by utilizing a sputtering method, a CVD method, an evaporation method, or the like.

Next, a resist mask 180 having a plurality of through holes 180a is formed over the metal film 166 (FIG. 11). The through holes 180a are provided at the positions corresponding to the pixels 104. The resist mask 180 may be formed by forming a photoresist with a wet-type film-formation method to entirely or almost entirely cover the metal film 166, followed by exposing the photoresist through a photomask and developing the photomask. A resist film may be adhered to the metal film 166 as a photoresist, and then the resist film may be exposed and developed. The exposure may be carried out by using a known apparatus such as a stepper (reduction-projection exposure apparatus) and a direct drawing apparatus. In the former, light emitted from a light source and then passing through a photomask is condensed with projection lenses, and the condensed light is applied on the photoresist. In the latter, no photomask is used, and laser light is directly applied on the photoresist.

Here, a material included in the base film 162 may be used as a material included in the resist mask 180. That is, the resist mask 180 may be formed to have the same composition as the base film 162. For example, the base film 162 may be formed with a resin such as an acrylic resin, an epoxy resin, and a polyimide resin, and the resist mask 180 may be formed using a resin selected from the aforementioned resins so as to have the same composition as the base film 162.

Figure 12:
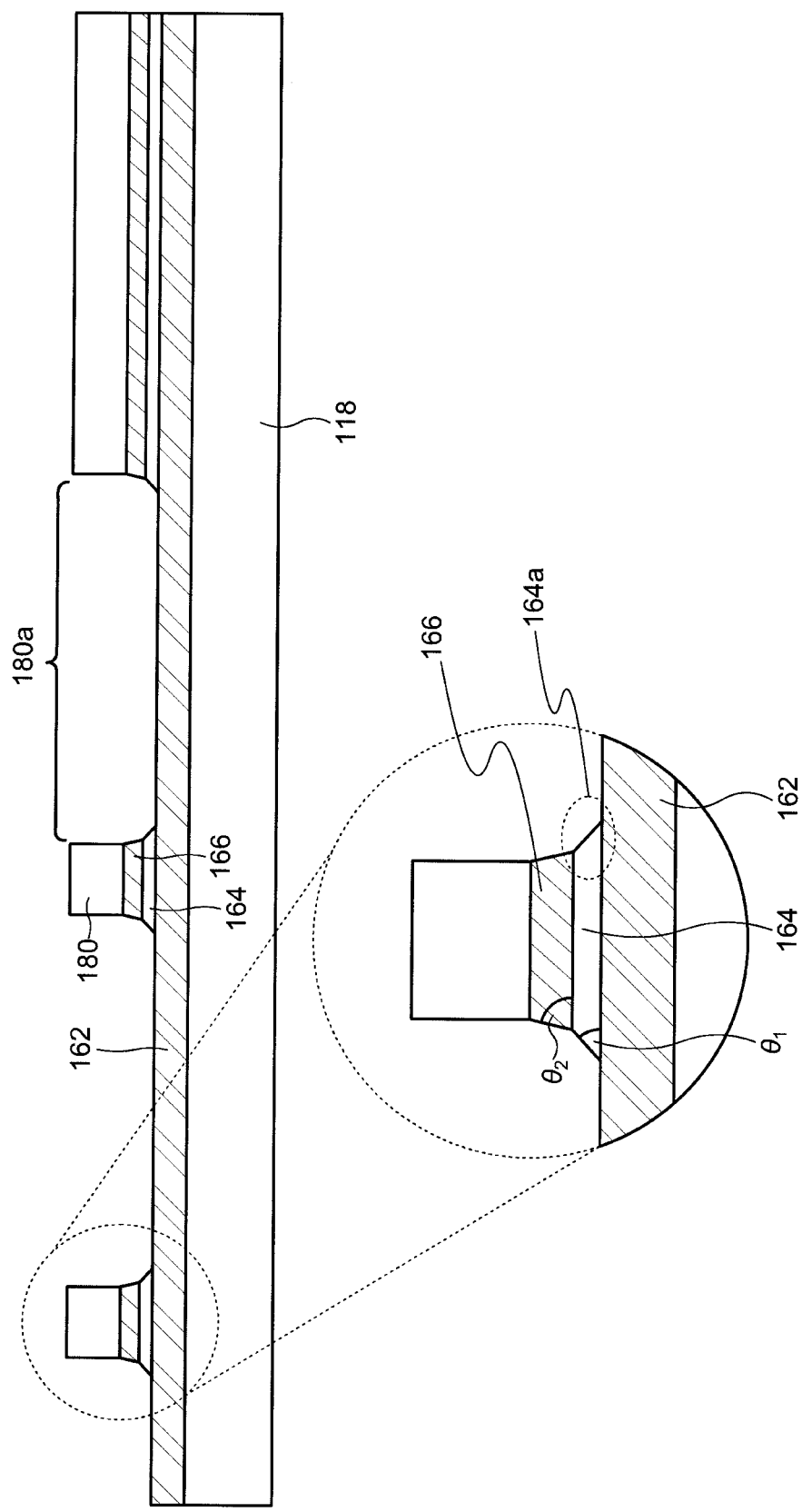
FIG. 12 is a schematic cross-sectional view showing a manufacturing method of a BM substrate according to an embodiment of the present invention.

After that, etching is simultaneously and selectively carried out on the metal film 166 and the low-reflectance film 164 in the through holes 180a to remove the portions exposed from the resist mask 180 (FIG. 12). The etching method may be dry etching or wet etching, and dry etching with high etching anisotropy is preferably applied. When the taper structure is provided to the light-shielding film 160, it is preferred to adjust the etching conditions so that an angle $\theta_2$ between a bottom surface (a surface parallel to the counter substrate 118 and closer to the counter substrate 118) and a side surface of the metal film 166 is larger than an angle $\theta_1$ between a bottom surface (a surface in contact with the base film 162) and a side surface of the low-reflectance film 164 (see an expanded view in FIG. 12). Specifically, the etching rate is adjusted by adjusting the thickness of the base film 162, the etching time thereof, and the film-formation conditions of the low-reflectance film 164 and the metal film 166.

After that, the resist mask 180 is removed (FIG. 13A). At this time, the base film 162 is simultaneously etched. Specifically, when the resist mask 180 is removed by etching, the metal film 166 and the low-reflectance film 164 are utilized as an etching mask for the base film 162, and the portions of the base film 162 which overlap the through holes 180a (i.e., the portions exposed from the metal film 166 and the low-reflectance film 164) are removed. The etching method may be dry etching or wet etching, and wet etching with high etching isotropy is preferably applied. When the resist mask 180 and the base film 162 are formed with the same material, simultaneous etching of the base film 162 and the resist mask 180 is more easily conducted because the same etching rate can be obtained for the resist mask 180 and the base film 162.

Figure 16:
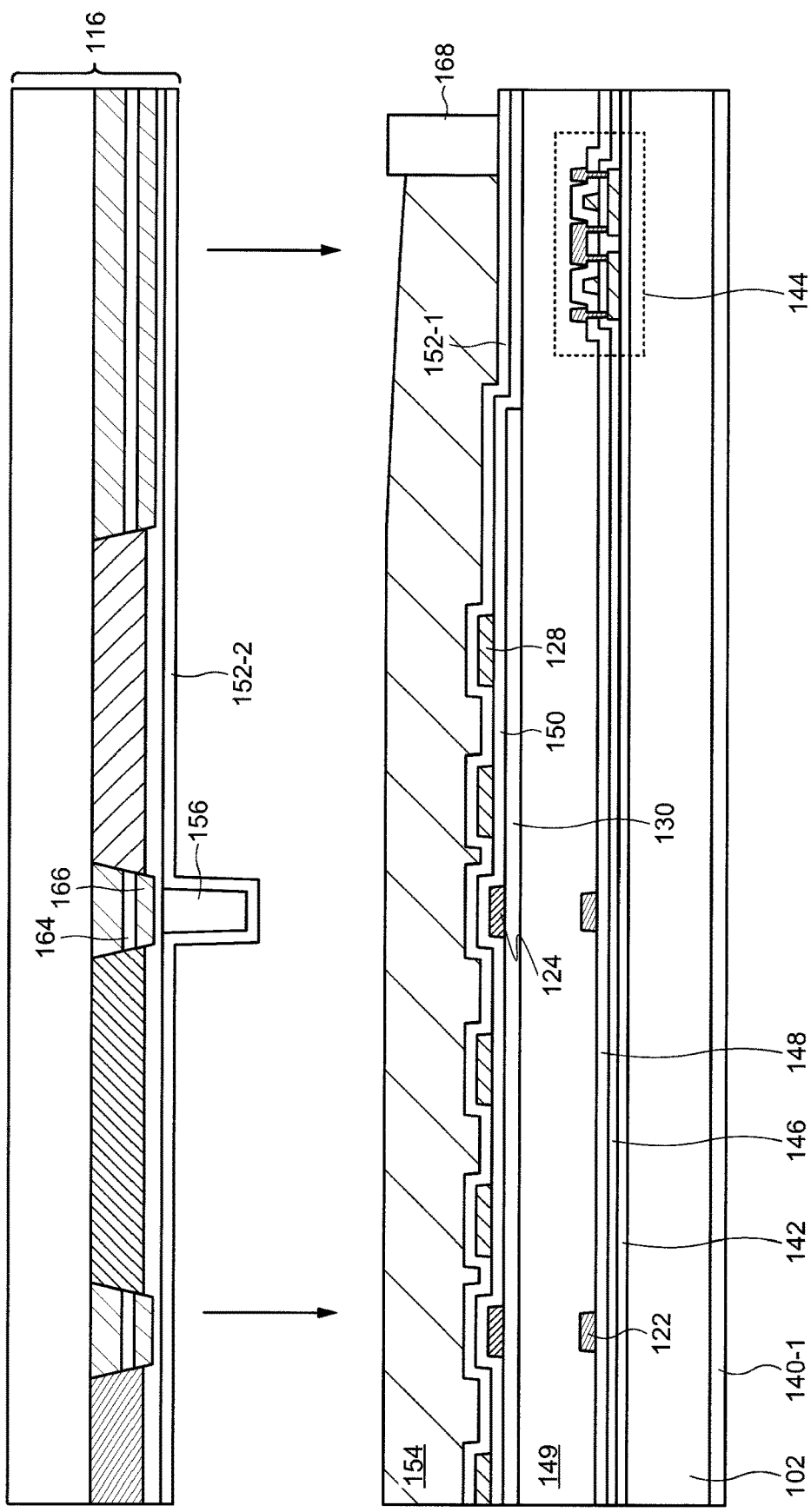
FIG. 16 is a schematic cross-sectional view showing a manufacturing method of a display device according to an embodiment of the present invention.

At this time, the etching conditions may be appropriately adjusted so that a portion 164a of the low-reflectance film 164 exposed from the metal film 166 (the portion surrounded by a dotted ellipse in an expanded view in FIG. 12. Hereinafter, this portion is also referred to as a visor) is left, by which a step can be formed between the low-reflectance film 164 and the base film 162 as shown in FIG. 16. Specifically, the film-formation conditions of the metal film 166 are adjusted to increase the etching rates of the resist mask 180 and the base film 162 with respect to an etchant, by which the step formation can be realized. On the other hand, the etching conditions may be adjusted so that this step is removed when the base film 162 is etched, by which the light-shielding film 160 in which the side surfaces of the low-reflectance film 164 and the base film 162 are continuous can be formed as shown in FIG. 5A to FIG. 5C and FIG. 13A. Specifically, the visor 164a of the low-reflectance film 164 can be removed using a high-pressure injection unit or the like in a substrate-cleaning process after etching.

Figure 14A:
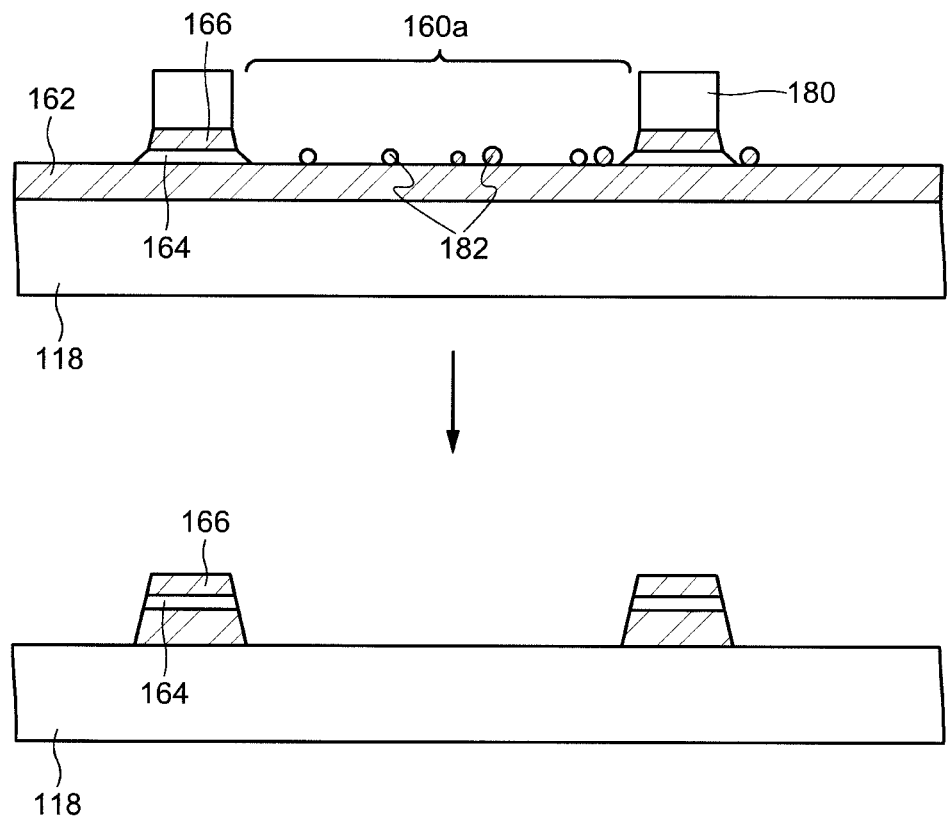
FIG. 14A and FIG. 14B are schematic cross-sectional views showing manufacturing methods of a BM substrate according to an embodiment of the present invention and a conventional BM substrate, respectively.

As described above, the process for etching the metal film 166 and the process for etching the low-reflectance film 164 (a process to remove the resist mask 180) are performed as different processes in the etching process of the base film 162, by which the etching residue generated during the etching of the metal film 166 and the low-reflectance film 164 can be very effectively removed. More specifically, when the metal film 166 and the low-reflectance film 164 are etched, etching residue 182 may be generated and left on the base film 162 as shown in FIG. 14A even if cleaning is performed after the etching. Particularly, in the case where the BM substrate 116 for an ultra-high-definition display device having small-sized pixels 104 is prepared, the area of the opening 160a is also small. Hence, if etching residue 182 is left in the opening 160a, black spots are generated in the pixel 104, resulting in a decrease in display quality because the light is shielded by the etching residue 182. However, the etching residue 182 left over the base film 162 is removed together with the base film 162 because the base film 162 is etched after the etching of the metal film 166 and the low-reflectance film 164 are completed in the present manufacturing method. As a result, it is possible to prevent the reduction in display quality caused by the etching residue 182.

Figure 14B:
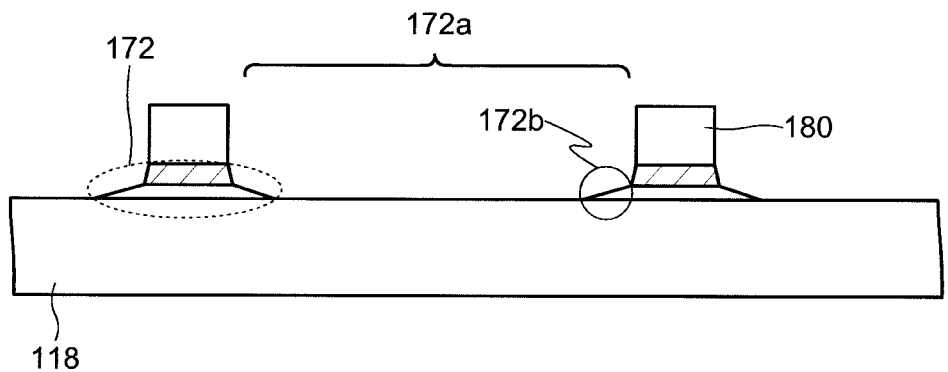

Moreover, the visor 172b resulting from the low-reflectance film 164 may significantly protrude unnecessarily toward the opening 172a depending on the etching conditions when the traditional light-shielding film 172 is prepared, and the visor 172b may be visually recognized as a spot (FIG. 14B). The formation of such a spot also results in a decrease in display quality. However, the etching of the base film 162 is further performed after etching the low-reflectance film 164 and the metal film 166 in the manufacturing method according to an embodiment of the present invention. Hence, the formation of a spot can be suppressed because the remaining large visor 164a which is unintentional can be removed or reduced in size when the base film 162 is removed.

After that, the color filters 158 are formed in the openings 160a (FIG. 13B). The color filters 158 may be formed by utilizing a spin-coating method, an ink-jet method, or the like. For example, ink of one of the color filters 158 (e.g., color filter 158-1) is applied in all of the openings 160a with a spin-coating method, and then the plurality of color filters 158-1 is formed in the target openings 160a by conducting light exposure thorough a photomask and development. Similar operations are carried out with respect to the other color filters 158-2 and 158-3, thereby forming the color filters 158.

Figure 15:
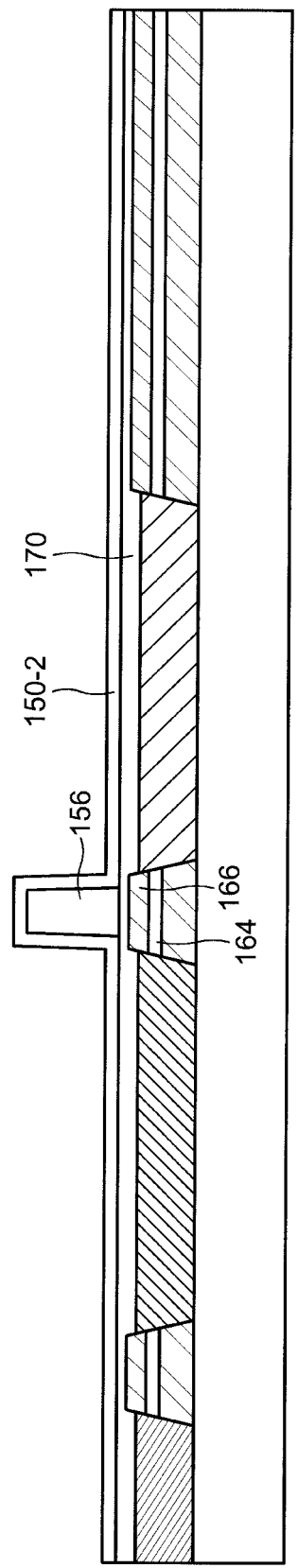
FIG. 15 is a schematic cross-sectional view showing a manufacturing method of a BM substrate according to an embodiment of the present invention.

After that, the overcoat 170 is formed (FIG. 13B). When the overcoat 170 contains an inorganic compound, the overcoat 170 may be formed with a CVD method, a sputtering method, an evaporation method, or the like. On the other hand, when the overcoat 170 contains a resin, a wet-type film-formation method may be applied. Then, the spacer 156 is formed over the overcoat 170, which is followed by the formation of the orientation film 152-2 (FIG. 15). An explanation is omitted because the spacer 156 and the orientation film 152-2 can be prepared by applying the known materials and methods.

2. Cell Assembly

A variety of insulating films, conductive films, and semiconductor films patterned by photolithography is stacked over the array substrate 102 to form the pixels 104, the driver circuits, the terminals 112, the wirings, and the like. An explanation is omitted because these components can be formed by applying the known materials and methods.

After forming the pixels 104, the driver circuits, the terminal 112, the wirings, and the like over the array substrate 102, the sealer 168 is formed (FIG. 16). The sealer 168 is a photocurable resin and is applied using a dispenser or the like so as to surround the display region 106. The liquid crystal serving as the liquid crystal layer 154 is dropped on the array substrate 102 before the sealer 168 completely cures, and then the BM substrate 116 is arranged over the array substrate 102 so that the pixels 104, the color filters 158, and the like are sandwiched by the array substrate 102 and the counter substrate 118 (FIG. 16). The sealer 168 is then cured in a state where the BM substrate 116 and the sealer 168 are in contact with each other to fix the BM substrate 116 and the array substrate 102 to each other. Note that the sealer 168 may be applied on the BM substrate 116, and the liquid crystal may be dropped on the BM substrate 116. Alternatively, the array substrate 102 and the BM substrate 116 may be fixed using the sealer 168, and then the liquid crystal may be injected to the space formed by the array substrate 102, BM substrate 116, and the sealer 168.

The display device 100 according to an embodiment of the present invention can be manufactured by the aforementioned method. As described above, this method is capable of preventing the etching residue generated during the etching of the metal film 166 and the low-reflectance film 164 from remaining. Therefore, it is possible to prevent a decrease in display quality and yield caused by the etching residue, and an ultra-high-definition display device can be produced at a high productivity.

Third Embodiment

In the present embodiment, a display device 200 different from the display device 100 described in the First Embodiment is explained. An explanation of the structures the same as or similar to those described in the First or Second Embodiment may be omitted.

Figure 17:
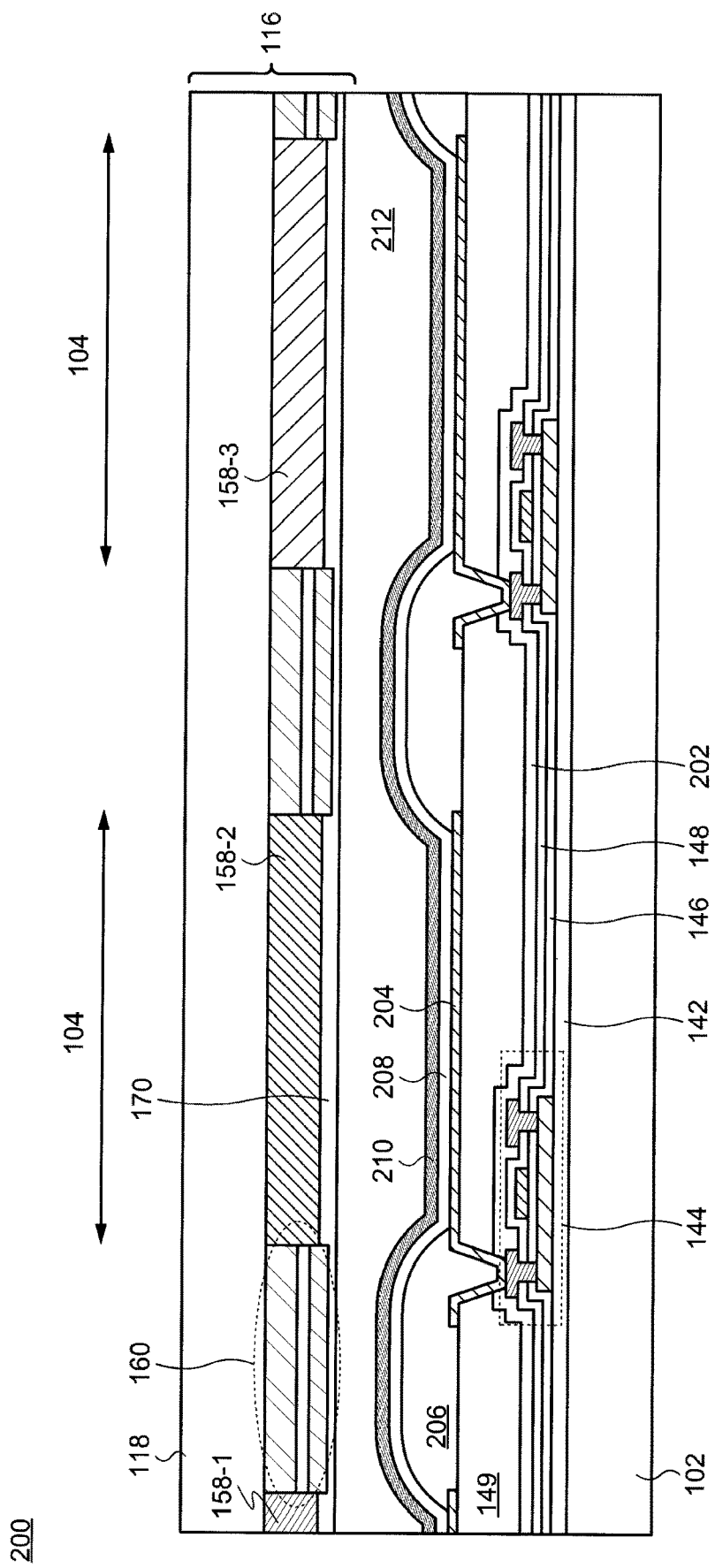
FIG. 17 is a schematic cross-sectional view of a display device according to an embodiment of the present invention.

A difference of the display device 200 from the display device 100 is that a so-called top-emission-type electroluminescence element (hereinafter, simply referred to as a light-emitting element) is arranged in each of the pixels 104 of the display device 200. A schematic cross-sectional view of the display device 200 is illustrated in FIG. 17. In this figure, a schematic cross-sectional view of a plurality of pixels 104 is depicted. As demonstrated in FIG. 17, the leveling film 149 is arranged across the TFTs in the plurality of pixels 104 directly or through an interlayer insulating film 202, over which pixel electrodes 204 and a partition wall 206 covering edge portions of the pixel electrodes 204 and including an insulating material are disposed. An electroluminescence layer (hereinafter, referred to as an EL layer) 208 is formed to cover the partition wall 206 and the pixel electrodes 204, and a counter electrode 210 shared by the plurality of pixels 104 is further disposed over the EL layer 208. The light-emitting element is structured by the pixel electrode 204, the EL layer 208, and the counter electrode 210. Carriers are injected to the EL layer 208 by providing a potential difference equal to or larger than a threshold value between the pixel electrode 204 and the counter electrode 210, and the carriers recombine in the EL layer 208. The recombination generates an excited state of the molecules in the EL layer 208, and the light generated when the excited state is radiatively deactivated to the ground state can be extracted through the counter electrode 210.

The structure of the EL layer 208 may be arbitrarily determined, and the EL layer 208 may be formed by appropriately stacking functional layers such as a carrier-injection layer, a carrier-transporting layer, a carrier-blocking layer, an exciton-blocking layer, and an emission layer. For instance, the EL layer 208 may be configured so that white emission is obtained from each of the plurality of pixels 104 and color information may be provided to this light with the color filters 158, by which full-color display can be realized. Although a detailed explanation is omitted, a plurality of TFTs including the TFT 144 and capacitor elements are appropriately arranged in the pixel circuit disposed in each pixel 104 to drive the light-emitting element.

A sealing film 212 for protecting the light-emitting elements may be disposed over the light-emitting elements, and the BM substrate 116 is arranged over the light-emitting elements. Unlike the BM substrate 116 of the display device 100, the orientation film 152 may not be provided.

Alternatively, the plurality of pixels 104 may be structured by a plurality of red-emissive pixels 104, a plurality of green-emissive pixels 104, and a plurality of blue-emissive pixels 104. In this case, different emission materials are arranged in the EL layers 208 of the adjacent EL layer 208 so that different emissions can be obtained from the adjacent pixels 104. For example, as shown in FIG. 18, the EL layer 208 may be structured by a hole-injection/transporting layer 208a, an emission layer 208b, an electron-injection/transporting layer 208c, and the like, where the emission materials included in the emission layers 208b are different from each other between the adjacent pixels 104. The hole-injection/transporting layer 208a, the emission layer 208b, and the electron-injection/transporting layer 208c are each structured by one or a plurality of functional layers.

In the display device 200 shown in FIG. 18, the color information is provided by the emission layer 208b. Hence, the BM substrate 116 may not include the color filter 158. Thus, the overcoat 170 may be disposed so as to be in contact with the counter substrate 118 or an undercoat which is not illustrated.

The display device 200 is also provided with the BM substrate 116 similar to that of the display device 100. Hence, it is possible to achieve the effects the same as those described in the First and Second Embodiments by implementing the present embodiment.

Fourth Embodiment

In the present embodiment, the BM substrate 116 is used as one component of a liquid crystal element. As such a liquid crystal element, a lens panel or a viewing-angle-controlling panel disposed over a display device, a light-distribution-controlling panel disposed over a lighting device, and the like are represented. In such a liquid crystal element, it may not be necessary to provide color information to the light passing through the liquid crystal element. In such a case, no color filter is disposed in the openings of the light-shielding film 160 as shown in FIG. 19. More specifically, the BM substrate 116 has an effective region 190 through which the light passes as well as a frame region 192 surrounding the effective region 190 as shown in FIG. 19, where the surfaces of the light-shielding film 160 and the counter substrate 118 are covered by the overcoat 170 in the effective region 190. The overcoat 170 is in contact with not only the surface of the light-shielding film 160, that is, the surfaces of the base film 162, the low-reflectance film 164, and the metal film 166, but also the surface of the counter substrate 118. Moreover, a structure may also be employed in which a common electrode is disposed in the effective region or both the effective region and the frame region so as to overlap the overcoat 170. Note that, since the structure of the BM substrate of the present invention is the same as that of the First Embodiment other than the aforementioned features, the explanation thereof is omitted.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is understood that another effect different from that provided by each of the aforementioned embodiments is achieved by the present invention if the effect is obvious from the description in the specification or readily conceived by persons ordinarily skilled in the art.

What is claimed is:

1. A black-matrix substrate comprising:
a substrate; and
a light-shielding film over the substrate, the light-shielding film having a plurality of openings and including:
  a base film over the substrate;
  a metal film on a top surface of the base film, a thickness of the metal film being thinner than a thickness of the base film; and
  a low-reflection film located between the base film and the metal film and having an optical reflectance lower than that of the metal film, a thickness of the low-reflection film being thinner than a thickness of the base film,
wherein the substrate, the base film, the low-reflection film, and the metal film are stacked in this order,
the base film includes at least one of a resin and an inorganic compound,
the resin is selected from an acrylic resin, an epoxy resin, a polysiloxane resin, a polyimide resin, and a polyamide resin, and
the inorganic compound is selected from silicon-containing inorganic compounds.

2. The black-matrix substrate according to claim 1, wherein a width of the light-shielding film decreases with increasing distance from the substrate.

3. The black-matrix substrate according to claim 1, further comprising a plurality of color filters arranged in the plurality of openings,
wherein colors of two of the color filters that are adjacent to each other are different from each other and are each different from a color of the base film.

4. The black-matrix substrate according to claim 3, wherein the plurality of color filters is in contact with the base film.

5. The black-matrix substrate according to claim 3, wherein the plurality of color filters is in contact with the substrate.

6. The black-matrix substrate according to claim 3, wherein at least one of the plurality of color filters covers a top surface of the metal film.

7. The black-matrix substrate according to claim 3, wherein a height of the plurality of color filters is smaller than a height of the light-shielding film.

8. The black-matrix substrate according to claim 3, further comprising an overcoat in contact with top surfaces of the color filters and the light-shielding film.

9. The black-matrix substrate according to claim 1, wherein top surfaces of the substrate and the light-shielding film are in contact with an overcoat.

10. The black-matrix substrate according to claim 1, wherein the base film has a light-transmitting property.

11. A display device comprising:
an array substrate comprising a plurality of pixels; and
the black-matrix substrate according to claim 1, the black-matrix substrate being located over the array substrate,
wherein the black-matrix substrate further comprises a plurality of color filters arranged in the plurality of openings, and
the black-matrix substrate is arranged so that the light-shielding film is positioned between the substrate and the array substrate.

* * * * *